(12) United States Patent
Fukasawa et al.

(10) Patent No.: US 12,074,043 B2
(45) Date of Patent: Aug. 27, 2024

(54) TRANSFER DEVICE AND TEACHING METHOD OF ROBOT ARM

(71) Applicant: TOKYO ELECTRON LIMITED, Tokyo (JP)

(72) Inventors: Takami Fukasawa, Yamanashi (JP); Ryosuke Kanamaru, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 387 days.

(21) Appl. No.: 17/479,842

(22) Filed: Sep. 20, 2021

(65) Prior Publication Data
US 2022/0093432 A1 Mar. 24, 2022

(30) Foreign Application Priority Data
Sep. 23, 2020 (JP) .................. 2020-158203

(51) Int. Cl.
| | |
|---|---|
| H01L 21/67 | (2006.01) |
| B25J 9/16 | (2006.01) |
| B25J 13/08 | (2006.01) |
| H01L 21/687 | (2006.01) |

(52) U.S. Cl.
CPC ...... *H01L 21/67259* (2013.01); *B25J 9/1664* (2013.01); *B25J 13/089* (2013.01); *H01L 21/68707* (2013.01)

(58) Field of Classification Search
CPC .......... H01L 21/67259; H01L 21/68707; B25J 9/1664; B25J 13/089
See application file for complete search history.

(56) References Cited

U.S. PATENT DOCUMENTS

| | | | |
|---|---|---|---|
| 8,395,136 B2 | 3/2013 | Kondoh | |
| 10,953,539 B2* | 3/2021 | Yoshida | ............. G05B 19/42 |
| 2001/0002447 A1* | 5/2001 | Kawamatsu | ........... B25J 19/025 |
| | | | 700/229 |
| 2006/0015279 A1* | 1/2006 | Saeki | .................. B62D 57/032 |
| | | | 702/94 |
| 2008/0316505 A1* | 12/2008 | Graf | .................... H01L 21/681 |
| | | | 356/614 |
| 2010/0172720 A1 | 7/2010 | Kondoh | |
| 2011/0130864 A1* | 6/2011 | Hirota | .................... G05B 19/42 |
| | | | 901/3 |
| 2014/0107825 A1* | 4/2014 | Kubodera | ........ H01L 21/67766 |
| | | | 700/112 |
| 2015/0370246 A1* | 12/2015 | Yuk | ...................... H01L 21/681 |
| | | | 700/112 |
| 2018/0019154 A1 | 1/2018 | Yoshida et al. | |

(Continued)

FOREIGN PATENT DOCUMENTS

| | | |
|---|---|---|
| JP | H06-326172 A | 11/1994 |
| KR | 101031843 B1 | 5/2011 |
| KR | 10-2017-0108154 A | 9/2017 |

*Primary Examiner* — Jaime Figueroa
*Assistant Examiner* — Mohamad O El Sayah
(74) *Attorney, Agent, or Firm* — Fenwick & West LLP

(57) ABSTRACT

There is provided a transfer device for transferring a substrate. The transfer device comprises a robot arm having an arm for transferring the substrate and a driving unit for rotating the arm, a first light irradiation unit configured to irradiate light along a first optical path, a first light receiving unit configured to receive the light irradiated from the first light irradiation unit, and a control device configured to control the driving unit so that the arm is rotated across the first optical path.

16 Claims, 17 Drawing Sheets

(56) References Cited

U.S. PATENT DOCUMENTS

| | | | | |
|---|---|---|---|---|
| 2019/0198369 A1* | 6/2019 | Sakaue | ............ | H01L 21/67742 |
| 2019/0355604 A1* | 11/2019 | Kawabe | ............ | H01L 21/67196 |
| 2020/0144097 A1* | 5/2020 | Thaulad | ............ | H01L 21/67706 |
| 2020/0206917 A1* | 7/2020 | Yoshida | ................ | B25J 9/1656 |
| 2020/0206934 A1* | 7/2020 | Yoshida | ................ | B25J 9/1692 |
| 2022/0266454 A1* | 8/2022 | Sato | ........................ | B25J 15/04 |

* cited by examiner

TRANSFER DEVICE AND TEACHING METHOD OF ROBOT ARM

CROSS-REFERENCE TO RELATED APPLICATIONS

This application claims priority to Japanese Patent Application No. 2020-158203, filed on Sep. 23, 2020, the entire contents of which are incorporated herein by reference.

TECHNICAL FIELD

Various aspects and embodiments of the present invention relate to a transfer device and a teaching method of a robot arm.

BACKGROUND

Various robots are used in latest industrial fields. For example, in the field of semiconductor manufacturing, robot arms are used in transfer devices for transferring substrates. In the manufacturing process of semiconductor devices, it is required to realize fine processing with high precision. Therefore, teaching is performed in order to teach a transfer device with information such that the transfer device can transfer a substrate for a semiconductor device to a predetermined position in a processing device for processing the substrate with high precision. (see Japanese Patent Application Publication No. 1994-326172)

SUMMARY

The present invention is directed to providing a transfer device capable of performing teaching of a robot arm with high precision, and a teaching method of the robot arm.

In accordance with an aspect of the present disclosure, there is provided a transfer device for transferring a substrate. The transfer device comprises a robot arm having an arm for transferring the substrate and a driving unit for rotating the arm, a first light irradiation unit configured to irradiate light along a first optical path, a first light receiving unit configured to receive the light irradiated from the first light irradiation unit, and a control device configured to control the driving unit so that the arm is rotated across the first optical path. The control device performs a) a process of detecting a first rotation angle of the arm when a state in which the first optical path is not blocked by the arm is changed to a state in which the first optical path is blocked by the arm on the basis of whether the light irradiated from the first light irradiation unit is received by the first light receiving unit, b) a process of detecting a second rotation angle of the arm when the state in which the first optical path is blocked by the arm is changed to the state in which the first optical path is not blocked by the arm on the basis of whether the light irradiated from the first light irradiation unit is received by the first light receiving unit, and c) a process of specifying a position of a first rotation axis of the arm on the basis of a width of a portion of the arm passing through the first optical path, a position of a first intersection of the first optical path and the arm when the first optical path is blocked by the arm, the first rotation angle, and the second rotation angle.

DETAILED DESCRIPTION

Hereinafter, embodiments of a transfer device and a teaching method of a robot arm, which are disclosed herein, will be described in detail with reference to the accompanying drawings. In addition, the following embodiments are not limited to the disclosed transfer device and the teaching method of the robot arm.

First Embodiment

[Configuration of Processing System 1]

Figure 1:
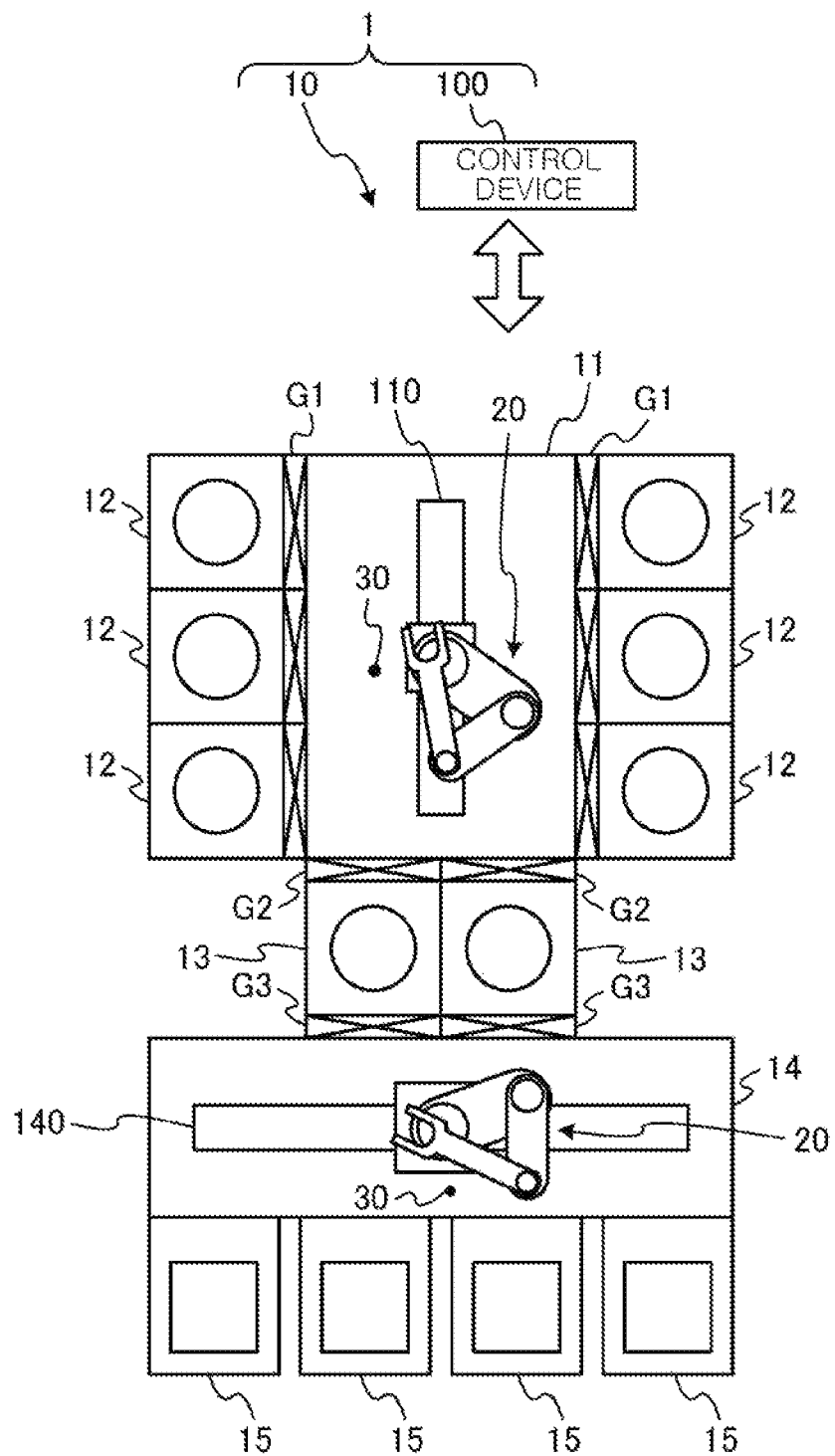
FIG. 1 is a schematic plan view illustrating an example of a processing system according to a first embodiment.

FIG. 1 is a schematic plan view illustrating an example of a processing system 1 according to the first embodiment. In FIG. 1, for better understanding, internal components of some devices are illustrated as being transparent. The processing system 1 includes a main body 10 and a control device 100 that controls the main body 10. The processing system 1 is an example of a transfer device.

The main body 10 includes a vacuum transfer module 11, a plurality of processing modules 12, a plurality of load lock modules 13, and an atmospheric transfer module 14. The plurality of processing modules 12 are connected to a sidewall of the vacuum transfer module 11 with gate valves G1 interposed therebetween. Although six processing modules 12 are connected to the vacuum transfer module 11 in the example of FIG. 1, the number of processing modules 12 connected to the vacuum transfer module 11 may be five or less or may be seven or more.

Each processing module 12 forms a semiconductor device on a substrate by performing a process such as etching, film formation, or the like on the substrate to be processed. The plurality of load lock modules 13 are connected to another sidewall of the vacuum transfer module 11 with gate valves G2 interposed therebetween. Although two load lock modules 13 are connected to the vacuum transfer module 11 in the example of FIG. 1, the number of load lock modules 13 connected to the vacuum transfer module 11 may be one or may be three or more.

In the vacuum transfer module 11, a robot arm 20 is disposed. The robot arm 20 is moved in the vacuum transfer module 11 along a guide rail 110 provided in the vacuum transfer module 11. In addition, the robot arm 20 transfers the substrate between one processing module 12 and another processing module 12 and between the processing module 12 and the load lock module 13. In addition, the robot arm 20 may be fixed at a predetermined position in the vacuum transfer module 11 and may not be moved in the vacuum transfer module 11. An inside of the vacuum transfer module 11 is maintained in a pressure atmosphere lower than atmospheric pressure.

The vacuum transfer module 11 is connected to one sidewall of each load lock module 13 with the gate valve G2 interposed therebetween, and the atmospheric transfer module 14 is connected to another sidewall of each load lock module 13 with a gate valve G3 interposed therebetween. When the substrate is loaded into the load lock module 13 from the atmospheric transfer module 14 through the gate valve G3, the gate valve G3 is closed and a pressure in the load lock module 13 is reduced from atmospheric pressure to a predetermined pressure. Then, the gate valve G2 is opened and the substrate in the load lock module 13 is unloaded into the vacuum transfer module 11 by the robot arm 20.

Further, in the state in which the pressure in the load lock module 13 is lower than atmospheric pressure, the substrate is loaded into the load lock module 13 from the vacuum transfer module 11 through the gate valve G2 by the robot arm 20 and the gate valve G2 is closed. Then, the pressure in the load lock module 13 is increased to atmospheric pressure. Then, the gate valve G3 is opened and the substrate in the load lock module 13 is unloaded into the atmospheric transfer module 14.

A plurality of load ports 15 are provided on a sidewall of the atmospheric transfer module 14 opposite to the sidewall of the atmospheric transfer module 14 on which the gate valves G3 are provided. A container such as a front opening unified pod (FOUP) or the like that may accommodate a plurality of substrates is connected to each load port 15. Further, an aligner module or the like that changes an orientation of the substrate may be provided in the atmospheric transfer module 14.

A pressure in the atmospheric transfer module 14 is atmospheric pressure. In the atmospheric transfer module 14, a robot arm 20 is provided. The robot arm 20 is moved in the atmospheric transfer module 14 along a guide rail 140 provided in the atmospheric transfer module 14 and transfers the substrate between the load lock module 13 and the container connected to the load port 15. In addition, the robot arm 20 may be fixed at a predetermined position in the atmospheric transfer module 14 and may not be moved in the atmospheric transfer module 14.

A fan filter unit (FFU) or the like is provided at an upper portion of the atmospheric transfer module 14 such that particles and the like are filtered form air, the filtered air is supplied into the atmospheric transfer module 14, and a downflow is formed in the atmospheric transfer module 14. In addition, in the present embodiment, the pressure in the atmospheric transfer module 14 is atmospheric pressure, but as another embodiment, the pressure in the atmospheric transfer module 14 may be controlled to be a positive pressure. Accordingly, it is possible to suppress the inflow of particles and the like into the atmospheric transfer module 14 from the outside.

Figure 2:
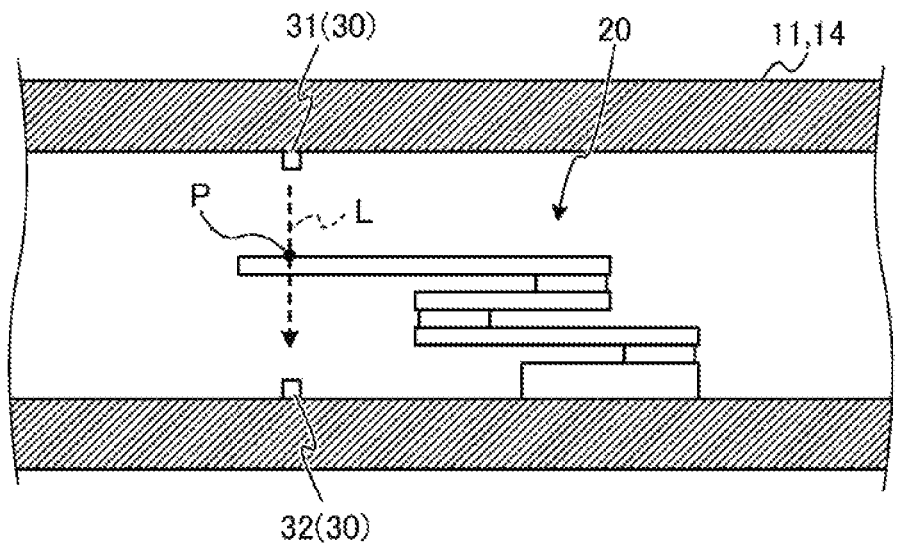
FIG. 2 is a schematic cross-sectional view illustrating an example of a vacuum transfer module and an atmospheric transfer module according to the first embodiment.

Further, in the vacuum transfer module 11 and in the atmospheric transfer module 14, a sensor 30 for detecting the position of the robot arm 20 is provided. FIG. 2 is a schematic cross-sectional view illustrating an example of the vacuum transfer module 11 and the atmospheric transfer module 14 according to the first embodiment. The sensor 30 has, for example, a light irradiation unit 31 and a light receiving unit 32, as illustrated in FIG. 2. The light irradiation unit 31 irradiates light along an optical path L. The light receiving unit 32 receives the light irradiated from the light irradiation unit 31. In the present embodiment, the light receiving unit 32 is provided on the optical path L. The light irradiation unit 31 is an example of a first light irradiation unit, the light receiving unit 32 is an example of a first light receiving unit, and the optical path L is an example of a first optical path.

In the present embodiment, the light irradiation unit 31 is, for example, a laser irradiation device and irradiates spot light having a diameter of several millimeters or less along the optical path L. In the present embodiment, the light irradiation unit 31 irradiates the light in a vertical direction. The light irradiated from the light irradiation unit 31 in the vertical direction is blocked by the robot arm 20 when the robot arm 20 crosses the optical path L. When the optical path L is blocked by the robot arm 20, the light irradiated from the light irradiation unit 31 is irradiated to a position P on the robot arm 20. The position P is an example of a position of a first intersection of the optical path L and the robot arm 20 when the optical path L is blocked by the robot arm 20.

In the present embodiment, the control device 100 determines whether the light irradiated from the light irradiation unit 31 is blocked by the robot arm 20 by determining whether the light receiving unit 32 receives the light irradiated from the light irradiation unit 31. In addition, the control device 100 determines whether the robot arm 20 passes through the vicinity of the sensor 30 by determining whether the light irradiated from the light irradiation unit 31 is blocked by the robot arm 20.

In the present embodiment, since the optical path L is an optical path in the vertical direction, the position P and positions of the light irradiation unit 31 and the light receiving unit 32 (i.e., a position of the sensor 30) coincide in a direction in a horizontal plane. In addition, as another embodiment, the light irradiation unit 31 may be provided at a lower portion of the vacuum transfer module 11, the light receiving unit 32 may be provided at an upper portion of the vacuum transfer module 11, and the light irradiation unit 31 may irradiate the light upward in the vertical direction.

Figure 3:
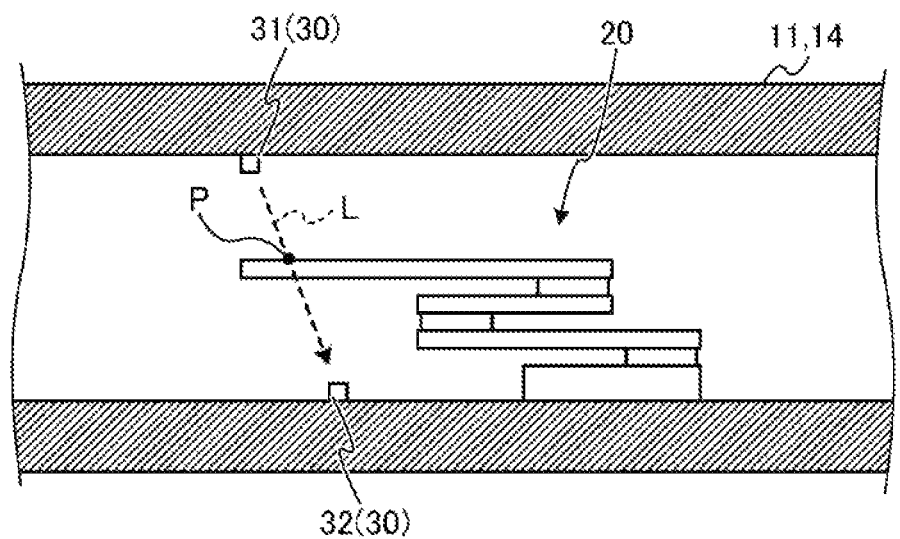
FIG. 3 is a schematic cross-sectional view illustrating another example of the vacuum transfer module and the atmospheric transfer module.

Further, in the present embodiment, the optical path L is the optical path in the vertical direction, but as another embodiment, the optical path L may be, for example, an optical path in a direction oblique to the vertical direction, as illustrated in FIG. 3. In the example of FIG. 3, the position P and the positions of the light irradiation unit 31 and the light receiving unit 32 (i.e., the position of the sensor 30) are different in a direction in a horizontal plane.

Figure 4:
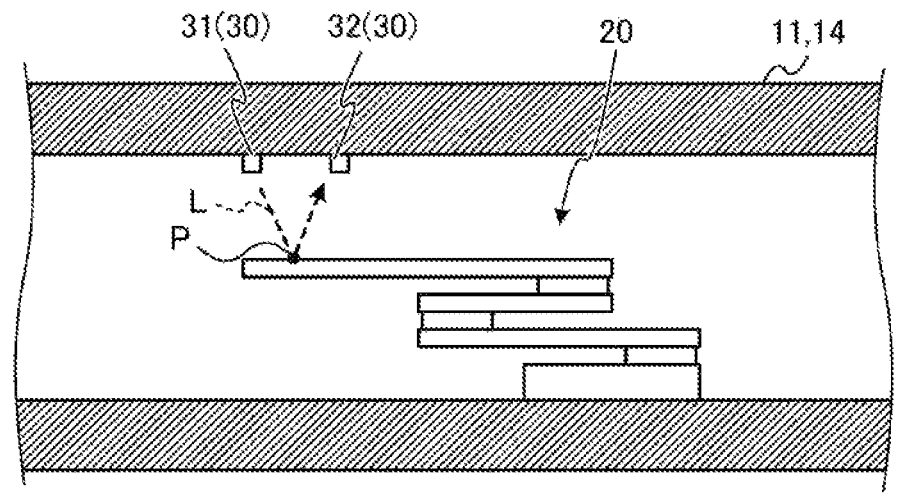
FIG. 4 is a schematic cross-sectional view illustrating still another example of the vacuum transfer module and the atmospheric transfer module.

Further, in the present embodiment, when the light irradiated from the light irradiation unit 31 is not received by the light receiving unit 32, the control device 100 determines that the light irradiated from the light irradiation unit 31 is blocked by the robot arm 20, but the disclosed technology is not limited thereto. For example, as illustrated in FIG. 4, when the light irradiated from the light irradiation unit 31 along the optical path L is reflected by the robot arm 20 at the position P and received by the light receiving unit 32, the control device 100 may determine that the light irradiated from the light irradiation unit 31 is blocked by the robot arm 20.

[Configuration of Robot Arm 20]

Figure 5:
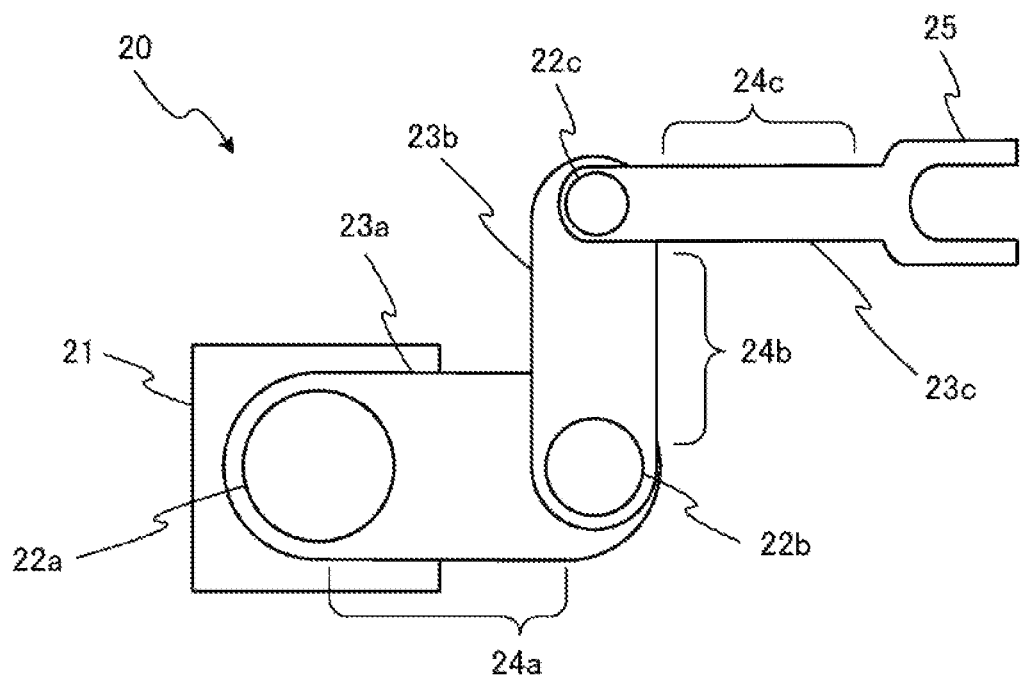
FIG. 5 is a view illustrating an example of a robot arm.

FIG. 5 is a view illustrating an example of the robot arm 20. The robot arm 20 has a base 21, a first driving unit 22a, a second driving unit 22b, a third driving unit 22c, a first arm 23a, a second arm 23b, and a third arm 23c. The first driving unit 22a and the first arm 23a are provided on the base 21. The second driving unit 22b and the second arm 23b are provided on the first arm 23a. The third driving unit 22c and the third arm 23c are provided on the second arm 23b. The first driving unit 22a is an example of a driving unit and the first arm 23a is an example of an arm.

The first arm 23a has a first portion 24a having a substantially constant outer width in a longitudinal direction of the first arm 23a. The second arm 23b has a second portion 24b having a substantially constant outer width in a longitudinal direction of the second arm 23b. The third arm 23c has a third portion 24c having a substantially constant outer width in a longitudinal direction of the third arm 23c. An end effector 25 on which the substrate is mounted is provided at a front end of the third arm 23c.

The first driving unit 22a rotates the first arm 23a with respect to the base 21 about a rotation axis of the first driving unit 22a. The second driving unit 22b rotates the second arm 23b with respect to the first arm 23a about a rotation axis of the second driving unit 22b. The third driving unit 22c rotates the third arm 23c with respect to the second arm 23b about a rotation axis of the third driving unit 22c.

[Teaching Method of Robot Arm 20]

Figure 6:
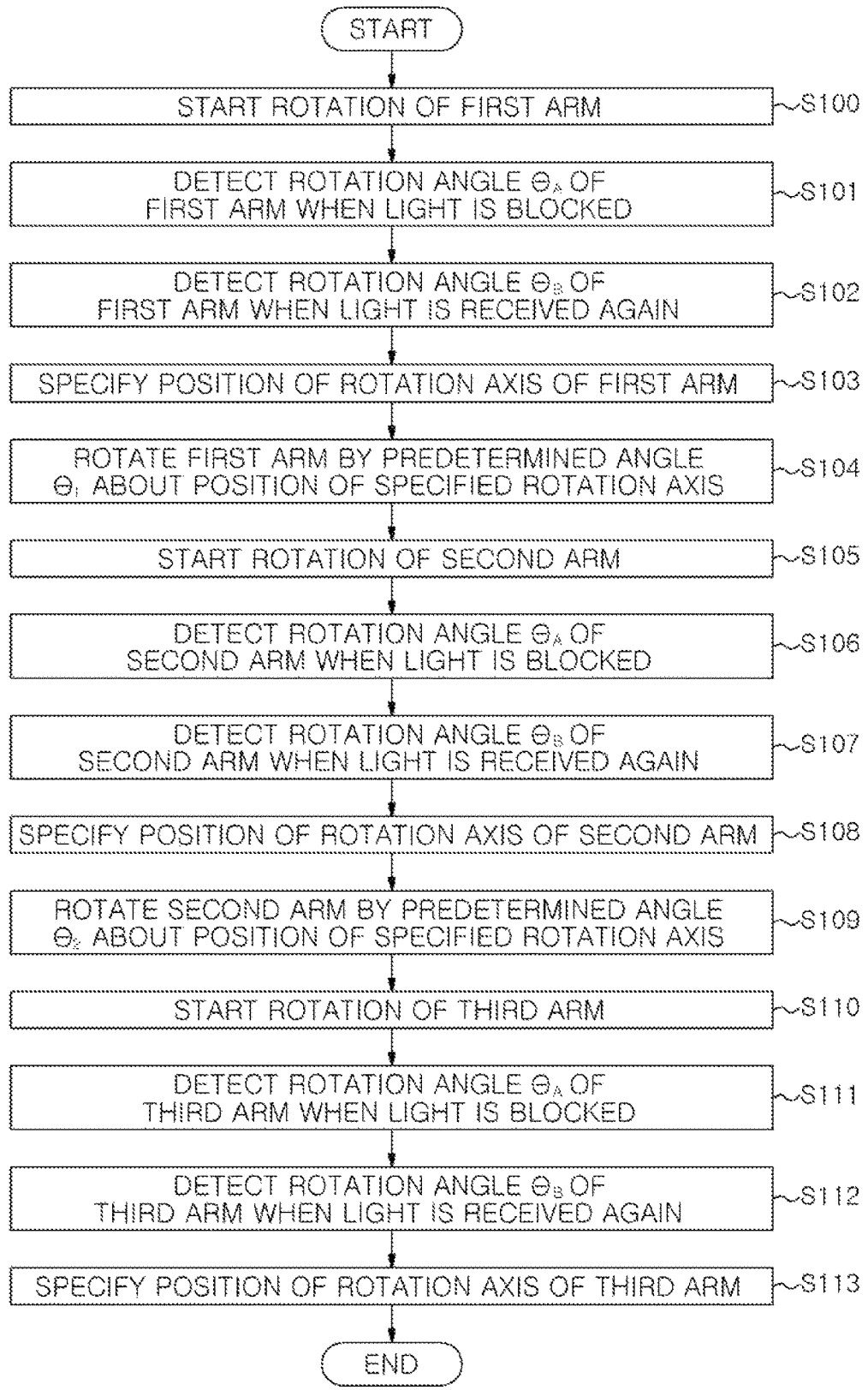
FIG. 6 is a flowchart illustrating an example of a teaching method of the robot arm according to the first embodiment.
Figure 7:
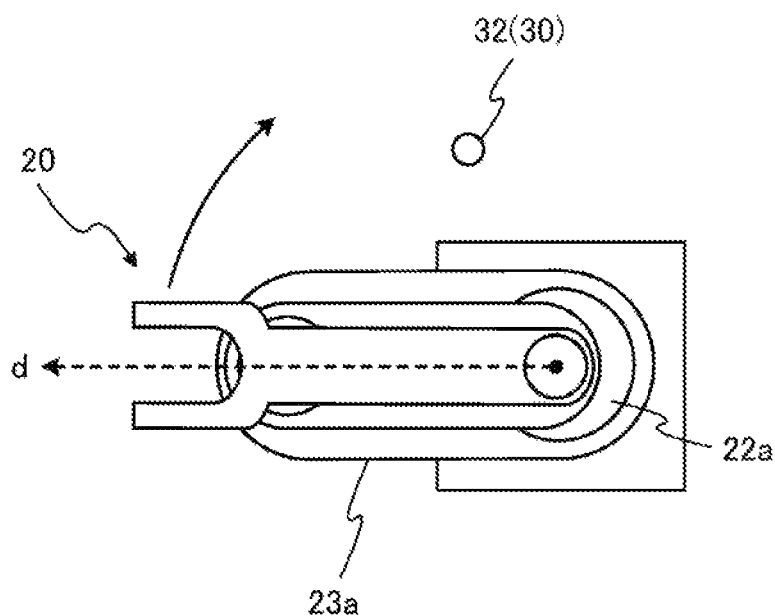
FIG. 7 is a view illustrating an example of a teaching procedure of a robot arm.

FIG. 6 is a flowchart illustrating an example of a teaching method of the robot arm 20 according to the first embodiment. As the control device 100 controls the robot arm 20 and the sensor 30, processes illustrated in FIG. 6 are realized. Before the processes illustrated in FIG. 6 start, the robot arm 20 is controlled, for example, to a position and posture as illustrated in FIG. 7. In an example illustrated in FIG. 7, the control device 100 controls the first driving unit 22a so that the first arm 23a faces a predetermined reference direction d in the vicinity of the light receiving unit 32.

First, the control device 100 controls the light irradiation unit 31 to irradiate light and confirms that the light irradiated from the light irradiation unit 31 is being received by the light receiving unit 32. In addition, for example, as illustrated in FIG. 7, the control device 100 controls the first driving unit 22a to start the rotation of the first arm 23a (S100). In step S100, the control device 100 controls the first driving unit 22a so that the first portion 24a of the first arm 23a passes over the light receiving unit 32. In the example of FIG. 7, although the first arm 23a is rotated in a clockwise direction, the first arm 23a may be rotated in a counterclockwise direction.

Figure 8:
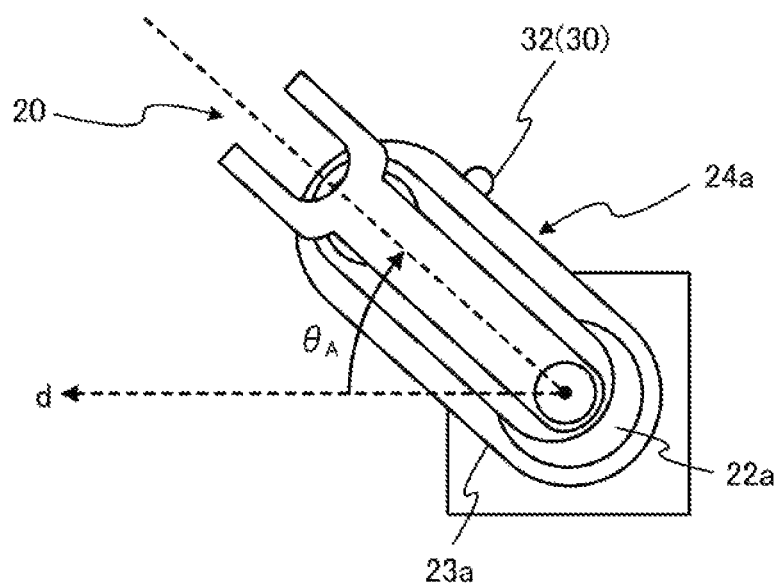
FIG. 8 is a view illustrating an example of the teaching procedure of the robot arm.

When the first arm 23a passes over the light receiving unit 32, for example, as illustrated in FIG. 8, the light irradiated from the light irradiation unit 31 is blocked by the first arm 23a and the light irradiated from the light irradiation unit 31 is not received by the light receiving unit 32. When the light irradiated from the light irradiation unit 31 is blocked by the first arm 23a, the control device 100 detects that a state in which the light irradiated from the light irradiation unit 31 is received by the light receiving unit 32 is changed to a state in which the light irradiated from the light irradiation unit 31 is not received by the light receiving unit 32. In addition, the control device 100 detects a rotation angle θA of the first arm 23a when the state in which the light irradiated from the light irradiation unit 31 is received by the light receiving unit 32 is changed to the state in which the light irradiated from the light irradiation unit 31 is not received by the light receiving unit 32 (S101). The step S101 is an example of a process a) and the rotation angle θA is an example of a first rotation angle.

Figure 9:
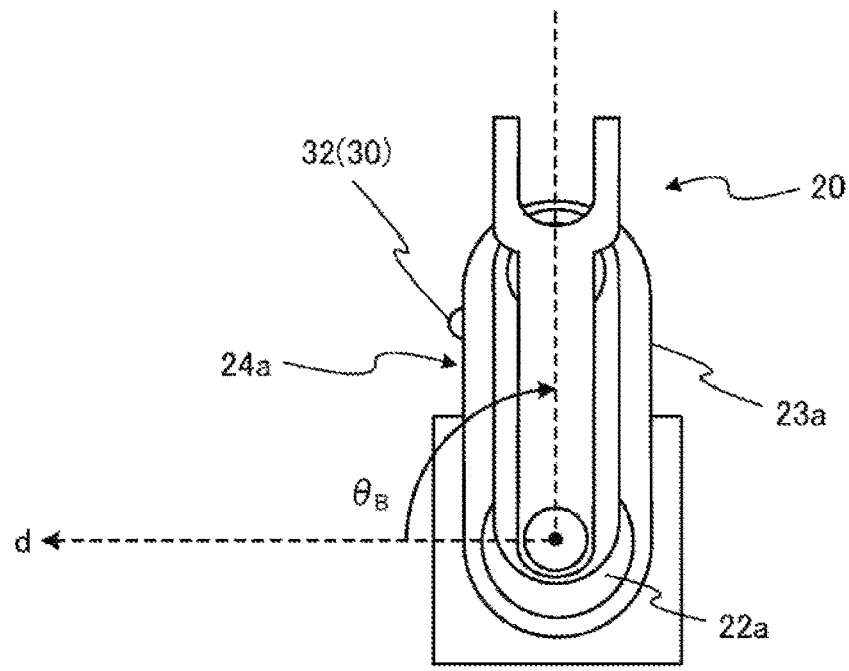
FIG. 9 is a view illustrating an example of the teaching procedure of the robot arm.

When the first arm 23a is further rotated, for example, as illustrated in FIG. 9, the light blocking by the first arm 23a is released and the light irradiated from the light irradiation unit 31 is received again by the light receiving unit 32. When the light blocking by the first arm 23a is released, the control device 100 detects that the state in which the light irradiated from the light irradiation unit 31 is not received by the light receiving unit 32 is changed to the state in which the light irradiated from the light irradiation unit 31 is received by the light receiving unit 32. In addition, the control device 100 detects a rotation angle θB of the first arm 23a when the state in which the light irradiated from the light irradiation unit 31 is not received by the light receiving unit 32 is changed to the state in which the light irradiated from the light irradiation unit 31 is received by the light receiving unit 32 (S102). The step S102 is an example of a process b) and the rotation angle θB is an example of a second rotation angle.

Next, the control device 100 specifies a position O of the rotation axis of the first arm 23a (S103). The step S103 is an example of a process c). In step S103, the control device 100 specifies the position O of the rotation axis of the first arm 23a on the basis of a width of the first portion 24a of the first arm 23a, the position P of the intersection of the optical path L and the first arm 23a, the rotation angle θA, and the rotation angle θB. The position O of the rotation axis of the first arm 23a is an example of a position of a first rotation axis.

Figure 10:
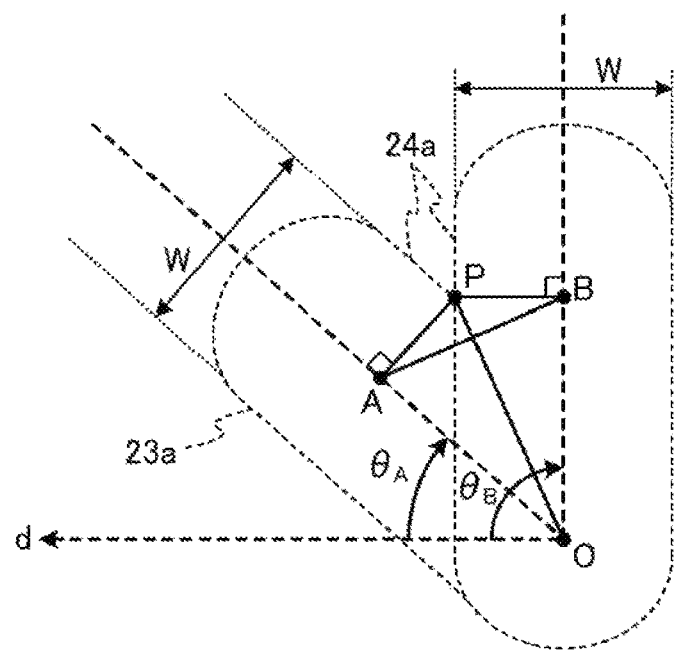
FIG. 10 is a view for describing an example of a method of specifying a position of a rotation axis of a first arm according to the first embodiment.

FIG. 10 is a view for describing an example of a method of specifying the position of the rotation axis of the first arm 23a according to the first embodiment. Since a triangle AOB illustrated in FIG. 10 is an isosceles triangle and an angle ∠AOB is (θB−θA), an angle ∠AOP becomes (θB−θA)/2. Further, since a width W of the first portion 24a of the first arm 23a is known, a length of a side AP in a right triangle AOP illustrated in FIG. 10 is W/2.

Accordingly, a length LPO of a side PO in the right triangle AOP illustrated in FIG. 10 is expressed by the following Equation (1).

$$L_{PO} = \frac{\frac{W}{2}}{\sin\left(\frac{\theta_B - \theta_A}{2}\right)} \quad (1)$$

Since ∠APO is 90 degrees-∠POA, a position separated by the length LPO in the direction of ∠APO from the position P may be specified as the position O of the rotation axis of the first arm 23a.

In addition, when the first arm 23a is rotated, for example, as illustrated in FIG. 10, the optical path L of the light irradiated from the light irradiation unit 31 is blocked by the first portion 24a having a substantially constant outer width in a longitudinal direction of the first arm 23a. The outer width of the first portion 24a is known. Since the optical path L is blocked by the first portion 24a of the first arm 23a, even when the position of the first arm 23a is slightly deviated from the light receiving unit 32, the length of the side AP in the triangle AOP of FIG. 10 may be specified precisely.

Figure 11:
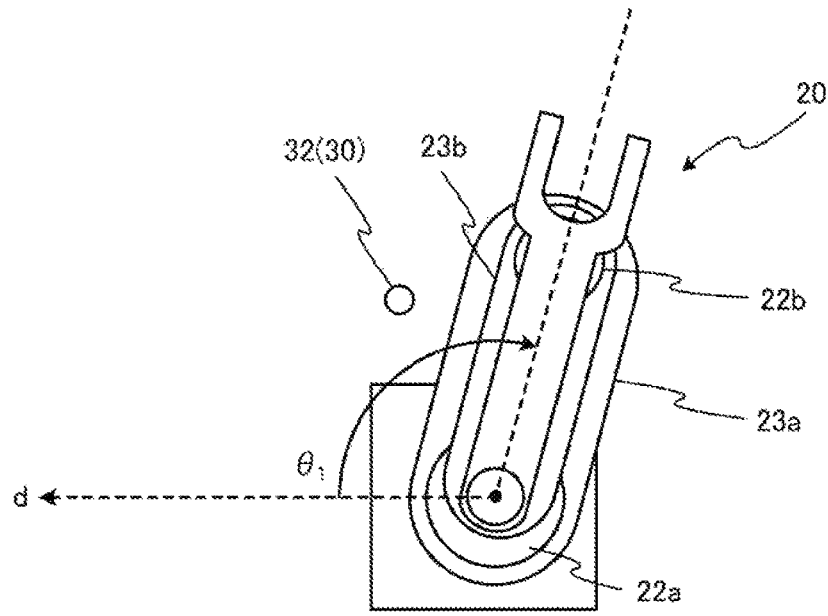
FIG. 11 is a view illustrating an example of a teaching procedure of the robot arm.

Next, for example, as illustrated in FIG. 11, the control device 100 rotates the first arm 23a by a predetermined angle θ1 about the position O of the rotation axis specified in step S103 (S104). The angle θ1 is an angle from the reference direction d and, in the present embodiment, the angle θ1 is, for example, 110 degrees. In the state illustrated in FIG. 11, the light irradiated from the light irradiation unit 31 is received by the light receiving unit 32.

Next, for example, in the state illustrated in FIG. 11, the control device 100 controls the second driving unit 22b to start the rotation of the second arm 23b in the clockwise direction (S105). In addition, the second arm 23b may be rotated in the counterclockwise direction.

In addition, when the second arm 23b passes over the light receiving unit 32, the light irradiated from the light irradiation unit 31 is blocked by the second arm 23b. The control device 100 detects that the state in which the light irradiated from the light irradiation unit 31 is received by the light receiving unit 32 is changed to the state in which the light irradiated from the light irradiation unit 31 is not received by the light receiving unit 32. In addition, the control device 100 detects a rotation angle θA of the second arm 23b when the state in which the light irradiated from the light irradiation unit 31 is received by the light receiving unit 32 is changed to the state in which the light irradiated from the light irradiation unit 31 is not received by the light receiving unit 32 (S106).

In addition, when the second arm 23b is further rotated and the light blocked by the second arm 23b is released, the control device 100 detects the state in which the light irradiated from the light irradiation unit 31 is not received by the light receiving unit 32 is changed to the state in which the light irradiated from the light irradiation unit 31 is received by the light receiving unit 32. In addition, the control device 100 detects a rotation angle θB of the second arm 23b when the state in which the light irradiated from the light irradiation unit 31 is not received by the light receiving unit 32 is changed to the state in which the light irradiated from the light irradiation unit 31 is received by the light receiving unit 32 (S107).

Figure 12:
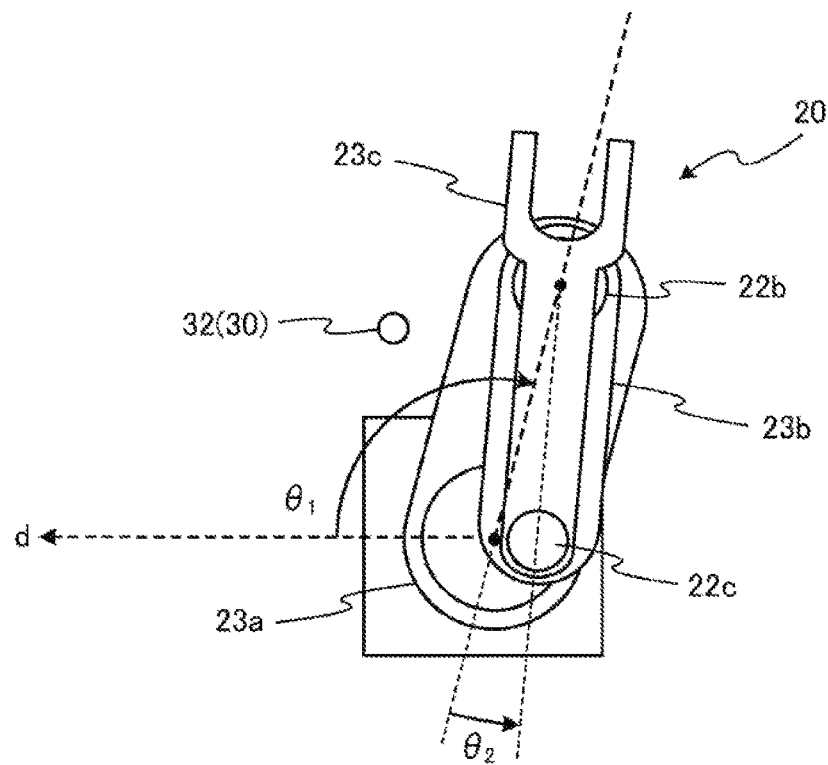
FIG. 12 is a view illustrating an example of the teaching procedure of the robot arm.

Next, the control device 100 specifies a position O of a rotation axis of the second arm 23b by a procedure similar to that in FIG. 10 (S108). In addition, for example, as illustrated in FIG. 12, the control device 100 rotates the second arm 23b by a predetermined angle θ2 about the position O of the rotation axis specified in step S108 (S109). The angle θ2 is an angle from the direction of the first arm 23a and, in the present embodiment, the angle θ2 is, for example, 10 degrees. In the state illustrated in FIG. 12, the light irradiated from the light irradiation unit 31 is received by the light receiving unit 32.

Next, for example, in the state illustrated in FIG. 12, the control device 100 controls the third driving unit 22c to start the rotation of the third arm 23c in the counterclockwise direction (S110). In addition, the third arm 23c may be rotated in the clockwise direction.

In addition, when the third arm 23c passes over the light receiving unit 32, the light irradiated from the light irradiation unit 31 is blocked by the third arm 23c. The control device 100 detects that the state in which the light irradiated from the light irradiation unit 31 is received by the light receiving unit 32 is changed to the state in which the light irradiated from the light irradiation unit 31 is not received by the light receiving unit 32. In addition, the control device 100 detects a rotation angle θA of the third arm 23c when the state in which the light irradiated from the light irradiation unit 31 is received by the light receiving unit 32 is changed to the state in which the light irradiated from the light irradiation unit 31 is not received by the light receiving unit 32 (S111).

In addition, when the third arm 23c is further rotated and the light blocking by the third arm 23c is released, the control device 100 detects the state in which the light irradiated from the light irradiation unit 31 is not received by the light receiving unit 32 is changed to the state in which the light irradiated from the light irradiation unit 31 is received by the light receiving unit 32. In addition, the control device 100 detects a rotation angle θB of the third arm 23c when the state in which the light irradiated from the light irradiation unit 31 is not received by the light receiving unit 32 is changed to the state in which the light irradiated from the light irradiation unit 31 is received by the light receiving unit 32 (S112).

Next, the control device 100 specifies a position O of a rotation axis of the third arm 23c by a procedure similar to that in FIG. 10 (S113). In addition, the control device 100 ends the teaching method of the robot arm 20 illustrated in the present flowchart. The positions of the rotation axes of the first arm 23a, the second arm 23b, and the third arm 23c are corrected based on the position of the rotation axis specified by the teaching method of the robot arm 20 illustrated in FIG. 6. Accordingly, the teaching of the robot arm 20 may be performed precisely.

As described above, the first embodiment has been described. In the present embodiment, the processing system 1 includes the robot arm 20, the light irradiation unit 31, the light receiving unit 32, and the control device 100. The robot arm 20 has the first arm 23a for transferring the substrate and the first driving unit 22a for rotating the first arm 23a. The light irradiation unit 31 irradiates the light along the optical path L. The light receiving unit 32 receives the light irradiated from the light irradiation unit 31. The control device 100 controls the first driving unit 22a so that the first arm 23a is rotated across the optical path L. Further, the control device 100 performs the process a), the process b), and the process c). In the process a), the rotation angle θA of the first arm 23a when the state in which the optical path L is not blocked by the first arm 23a is changed to the state in which the optical path L is blocked by the first arm 23a is detected based on whether the light irradiated from the light irradiation unit 31 is received by the light receiving unit 32. In the process b), the rotation angle θB of the first arm 23a when the state in which the optical path L is blocked by the first arm 23a is changed to the state in which the optical path L is not blocked by the first arm 23a is detected based on whether the light irradiated from the light irradiation unit 31 is received by the light receiving unit 32. In the process c), the position O of the rotation axis of the first arm 23a is specified based on the width of the first portion 24a of the first arm 23a, the position P of the intersection of the optical path L and the first arm 23a when the optical path L is blocked by the first arm 23a, the rotation angle θA, and the rotation angle θB. Accordingly, the teaching of the robot arm 20 may be performed with high precision.

Further, in the first embodiment, the light receiving unit 32 is provided above the optical path L. When the state in which the light receiving unit 32 receives the light irradiated from the light irradiation unit 31 is changed to the state in which the light receiving unit 32 does not receive the light irradiated from the light irradiation unit 31, the control device 100 determines that the state in which the optical path L is not blocked by the first arm 23a is changed to the state in which the optical path L is blocked by the first arm 23a. Further, when the state in which the light receiving unit 32 does not receive the light irradiated from the light irradiation unit 31 is changed to the state in which the light receiving unit 32 receives the light irradiated from the light irradiation unit 31, the control device 100 determines that the state in which the optical path L is blocked by the first arm 23a is changed to the state in which the optical path L is not blocked by the first arm 23a. Accordingly, whether the state in which the optical path L is not blocked by the first arm 23a is changed to the state in which the optical path L is blocked by the first arm 23a and whether the state in which the optical path L is blocked by the first arm 23a is changed to the state in which the optical path L is not blocked by the first arm 23a may be easily determined.

Further, in the above-described embodiment, the control device 100 controls the first driving unit 22a so that the portion of the first arm 23a having a constant outer width is rotated across the optical path L of the light irradiated from the light irradiation unit 31. Accordingly, even when the position of the first arm 23a is slightly deviated, the position O of the rotation axis of the first arm 23a may be specified precisely.

Further, in the above-described embodiment, the robot arm 20 has the first arm 23a, the second arm 23b provided on the first arm 23a, the first driving unit 22a which rotates the first arm 23a, and the second driving unit 22b which is provided on the first arm 23a and rotates the second arm 23b. The control device 100 performs the process a) to the process c) with respect to the first arm 23a by controlling the first driving unit 22a. In addition, the control device 100 controls the first arm 23a to a predetermined posture on the basis of the position of the rotation axis of the first arm 23a specified in the process c) and then performs the process a) to the process c) with respect to the second arm 23b by controlling the second driving unit 22. Accordingly, even in the case of the articulated robot arm 20, the teaching of the robot arm 20 may be performed with high precision.

Second Embodiment

In the first embodiment, the position of the rotation axis of the robot arm 20 is specified using one sensor 30 for one robot arm 20. However, in the robot arm 20, there may be a zero-point deviation of the rotation angle, an installation error of the robot arm 20, or the like. In such a case, it is difficult for one sensor 30 to precisely specify the position of the rotation axis of the robot arm 20. Therefore, in the present embodiment, the position of the rotation axis of the robot arm 20 is specified using two sensors 30 for one robot arm 20. Accordingly, even when there is a zero-point deviation of the rotation angle, an installation error of the robot arm 20, or the like, the position of the rotation axis of the robot arm 20 may be specified precisely.

[Configuration of Processing System 1]

Figure 13:
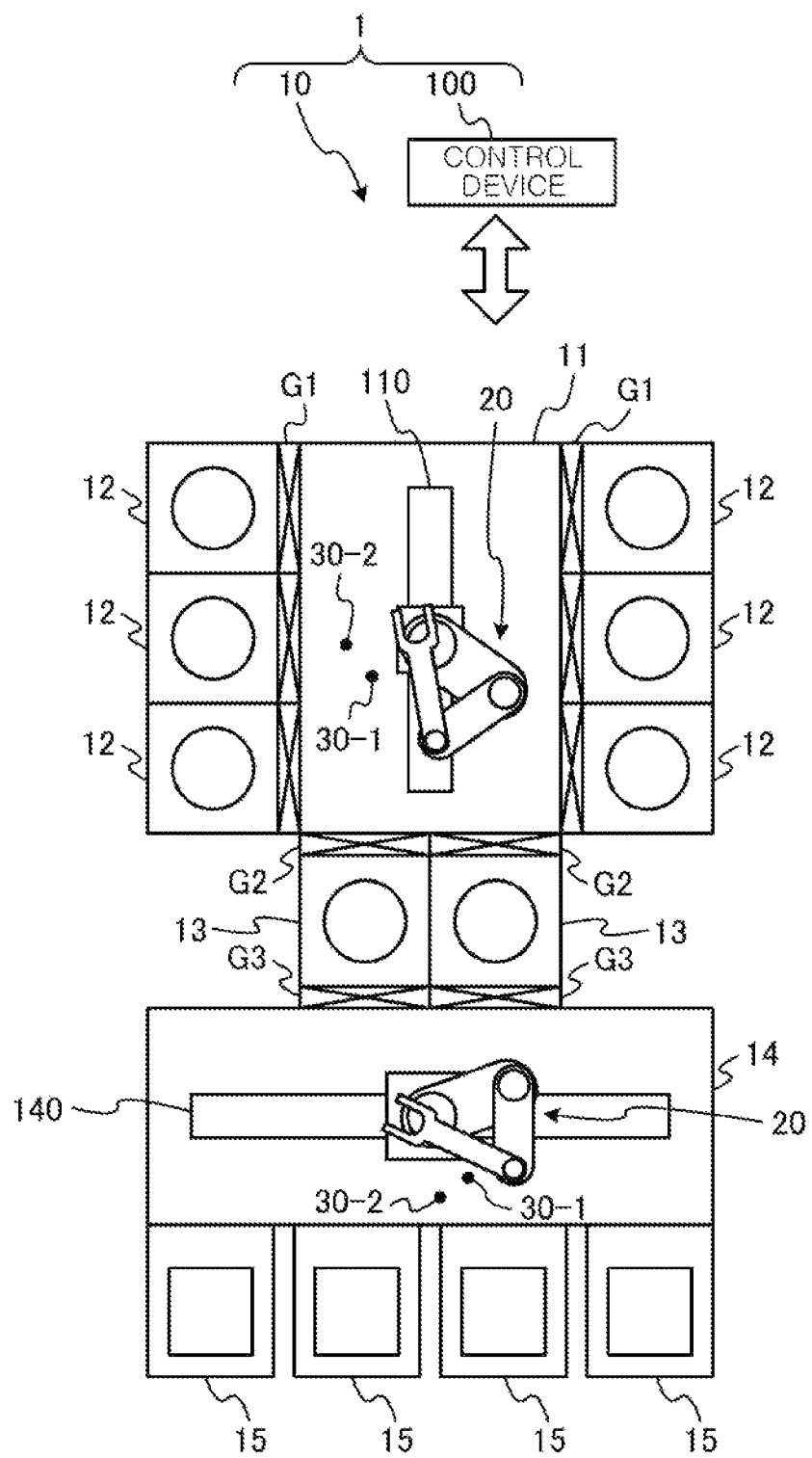
FIG. 13 is a schematic plan view illustrating an example of a processing system according to a second embodiment.

FIG. 13 is a schematic plan view illustrating an example of a processing system 1 according to a second embodiment. In FIG. 13, for convenience of description, internal components of some devices are illustrated as being transparent. In addition, except for the following point, in FIG. 13, the components with the same reference numerals as those in FIG. 1 are the same as those in FIG. 1 and have the same functions as those in FIG. 1, and thus descriptions thereof will be omitted.

Figure 14:
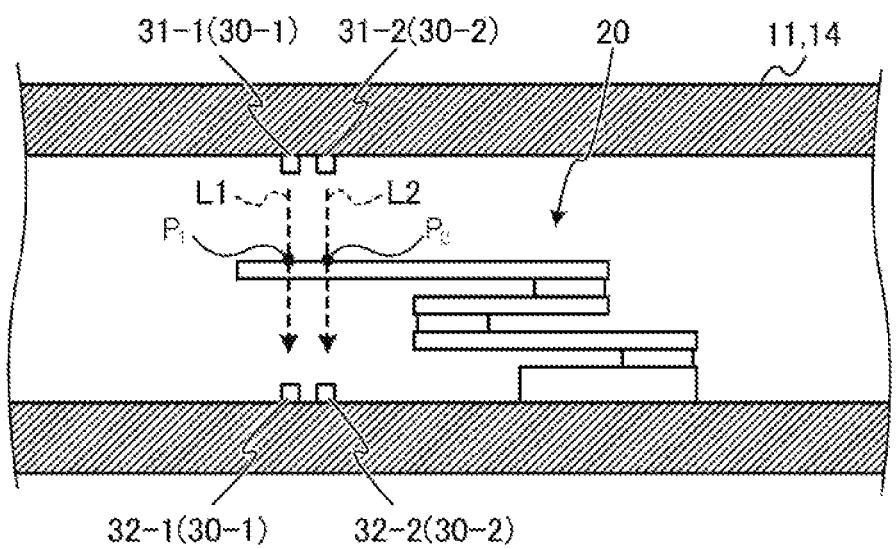
FIG. 14 is a schematic cross-sectional view illustrating an example of a vacuum transfer module and an atmospheric transfer module according to the second embodiment.

In a vacuum transfer module 11 and in an atmospheric transfer module 14, sensors 30-1 and 30-2 for detecting a position of a robot arm 20 are provided. FIG. 14 is a schematic cross-sectional view illustrating an example of the vacuum transfer module 11 and the atmospheric transfer module 14 according to the second embodiment. The sensor 30-1 has a light irradiation unit 31-1 and a light receiving unit 32-1. The sensor 30-2 has a light irradiation unit 31-2 and a light receiving unit 32-2. The light irradiation unit 31-1 irradiates light along an optical path L1 and the light irradiation unit 31-2 irradiates light along an optical path L2. The light receiving unit 32-1 is disposed on the optical path L1 and receives the light irradiated from the light irradiation unit 31-1. The light receiving unit 32-2 is disposed on the optical path L2 and receives the light irradiated from the light irradiation unit 31-2. The light irradiation unit 31-1 is an example of a first light irradiation unit and the light irradiation unit 31-2 is an example of a second light irradiation unit. Further, the light receiving unit 32-1 is an example of a first light receiving unit and the light receiving unit 32-2 is an example of a second light receiving unit. Further, the optical path L1 is an example of a first optical path and the optical path L2 is an example of a second optical path.

In the present embodiment, the light irradiation units 31-1 and 31-2 irradiate the light in a vertical direction. When the light irradiated from the light irradiation unit 31-1 in the vertical direction is blocked by the robot arm 20, the light irradiated from the light irradiation unit 31-1 is irradiated to a position P1 on the robot arm 20. The position P1 is an example of a position of a first intersection of the optical path L1 and the robot arm 20 when the optical path L1 is blocked by the robot arm 20. Further, when the light irradiated from the light irradiation unit 31-2 in the vertical direction is blocked by the robot arm 20, the light irradiated from the light irradiation unit 31-2 is irradiated to a position P2 on the robot arm 20. The position P2 is an example of a position of a second intersection of the optical path L2 and the robot arm 20 when the optical path L2 is blocked by the robot arm 20.

In the present embodiment, the control device 100 determines whether the light irradiated from the light irradiation unit 31-1 is blocked by the robot arm 20 by determining whether the light receiving unit 32-1 receives the light irradiated from the light irradiation unit 31-1. Further, the control device 100 determines whether the light irradiated from the light irradiation unit 31-2 is blocked by the robot arm 20 by determining whether the light receiving unit 32-2 receives the light irradiated from the light irradiation unit 31-2.

In the present embodiment, since the optical path L1 is an optical path in the vertical direction, the position P1 and positions of the light irradiation unit 31-1 and the light receiving unit 32-1 (i.e., a position of the sensor 30-1) coincide with each other in a direction in a horizontal plane. Further, since the optical path L2 is an optical path in the vertical direction, the position P2 and positions of the light irradiation unit 31-2 and the light receiving unit 32-2 (i.e., a position of the sensor 30-2) coincide with each other in a direction in a horizontal plane. In addition, in the present embodiment, the light irradiation units 31-1 and 31-2 may be provided at a lower portion of the vacuum transfer module 11 and the light receiving units 32-1 and 32-2 may be provided at an upper portion of the vacuum transfer module 11.

Further, in the present embodiment, the optical path L1 and the optical path L2 may be optical paths in a direction oblique to the vertical direction, for example, similar to that in FIG. 3. Further, for example, as illustrated in FIG. 4, when the light irradiated from the light irradiation unit 31-1 along the optical path L1 is reflected at the position P1 and received by the light receiving unit 32-1, the control device 100 may determine that the light irradiated from the light irradiation unit 31-1 is blocked by the robot arm 20. Further, for example, as illustrated in FIG. 4, when the light irradiated from the light irradiation unit 31-2 along the optical path L2 is reflected at the position P2 and received by the light receiving unit 32-2, the control device 100 may determine that the light irradiated from the light irradiation unit 31-2 is blocked by the robot arm 20.

[Teaching Method of Robot Arm 20]

Figure 15:
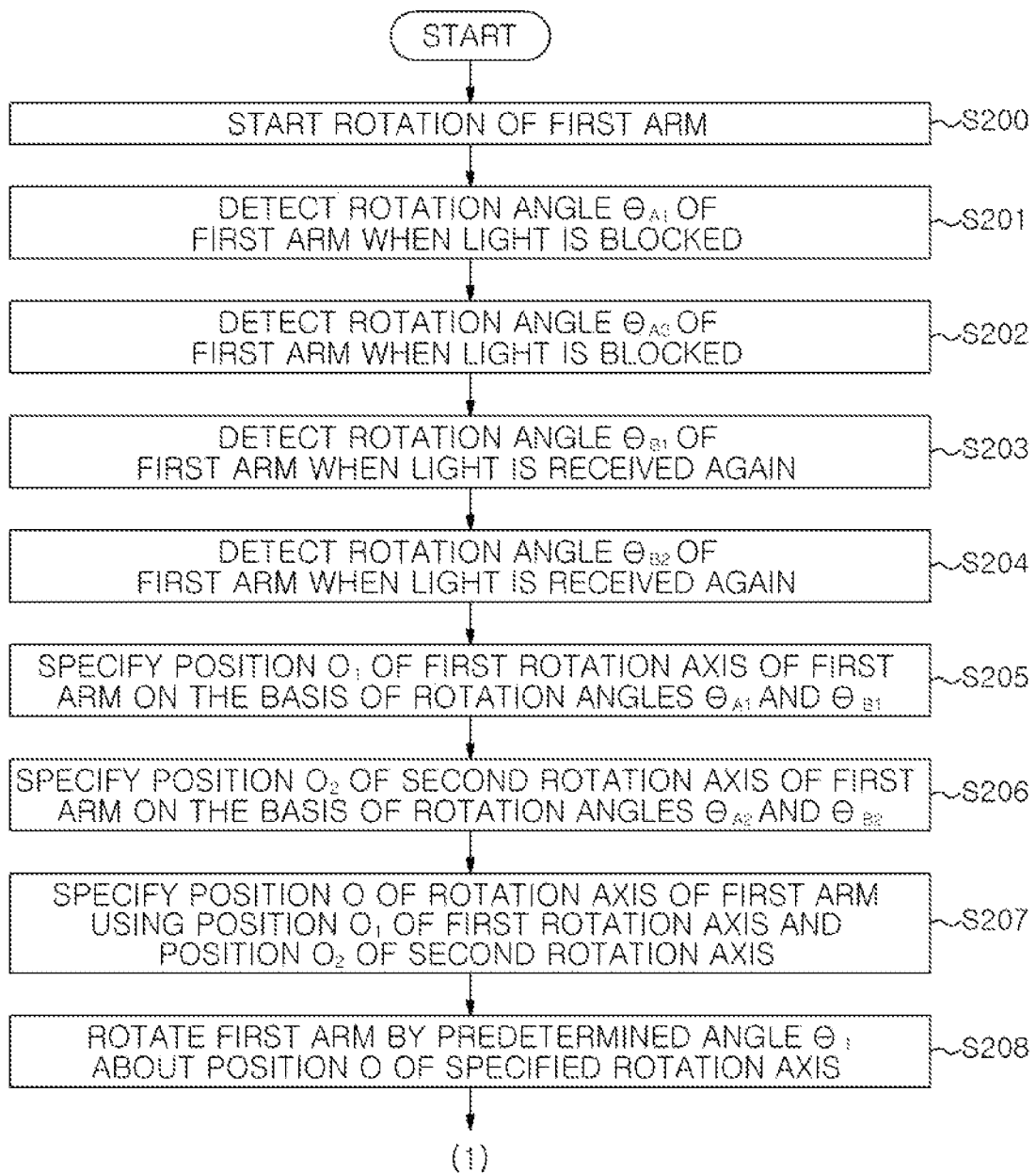
FIG. 15 is a flowchart illustrating an example of a teaching method of a robot arm according to the second embodiment.
Figure 16:
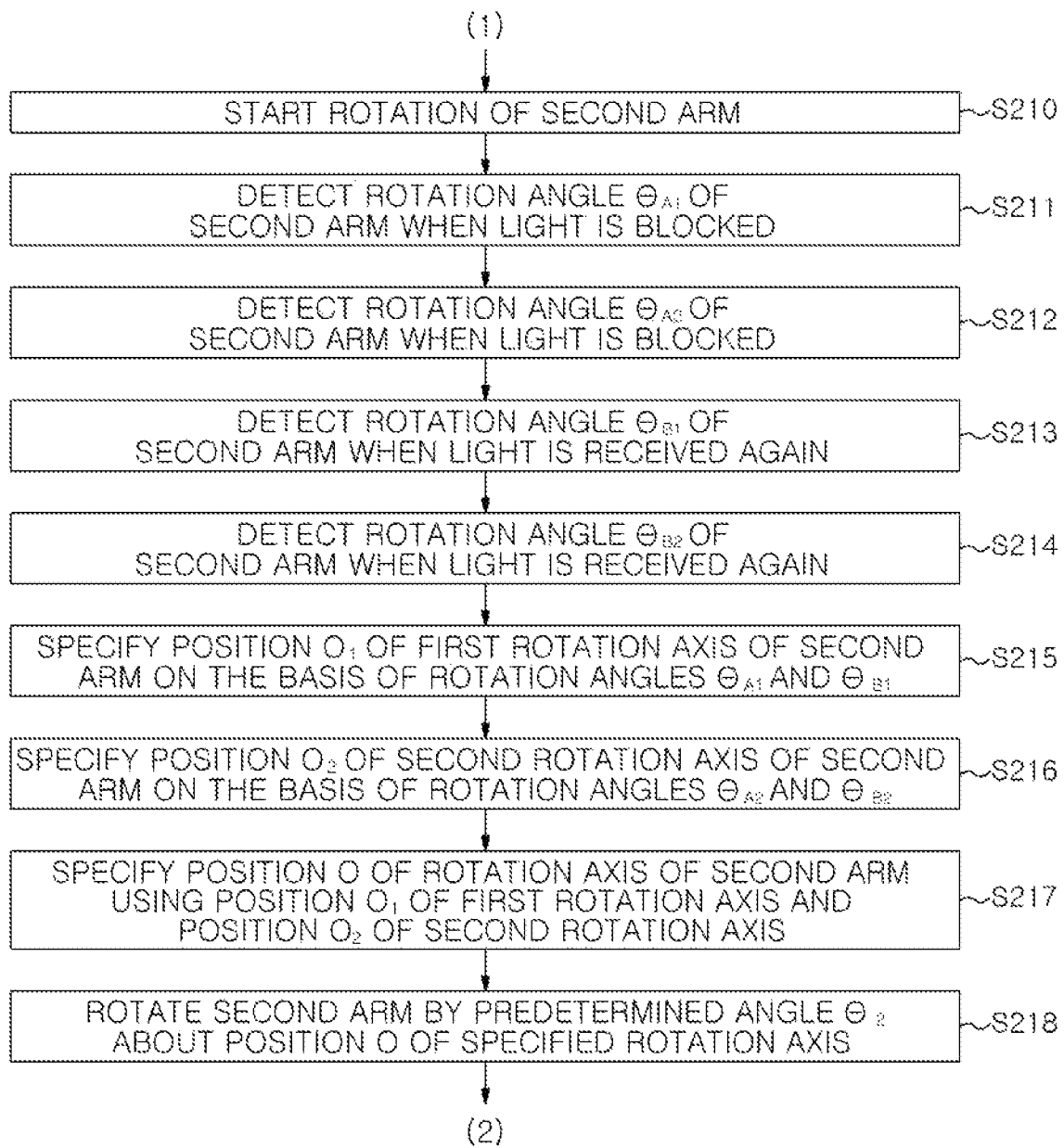
FIG. 16 is a flowchart illustrating the example of the teaching method of the robot arm according to the second embodiment.
Figure 17:
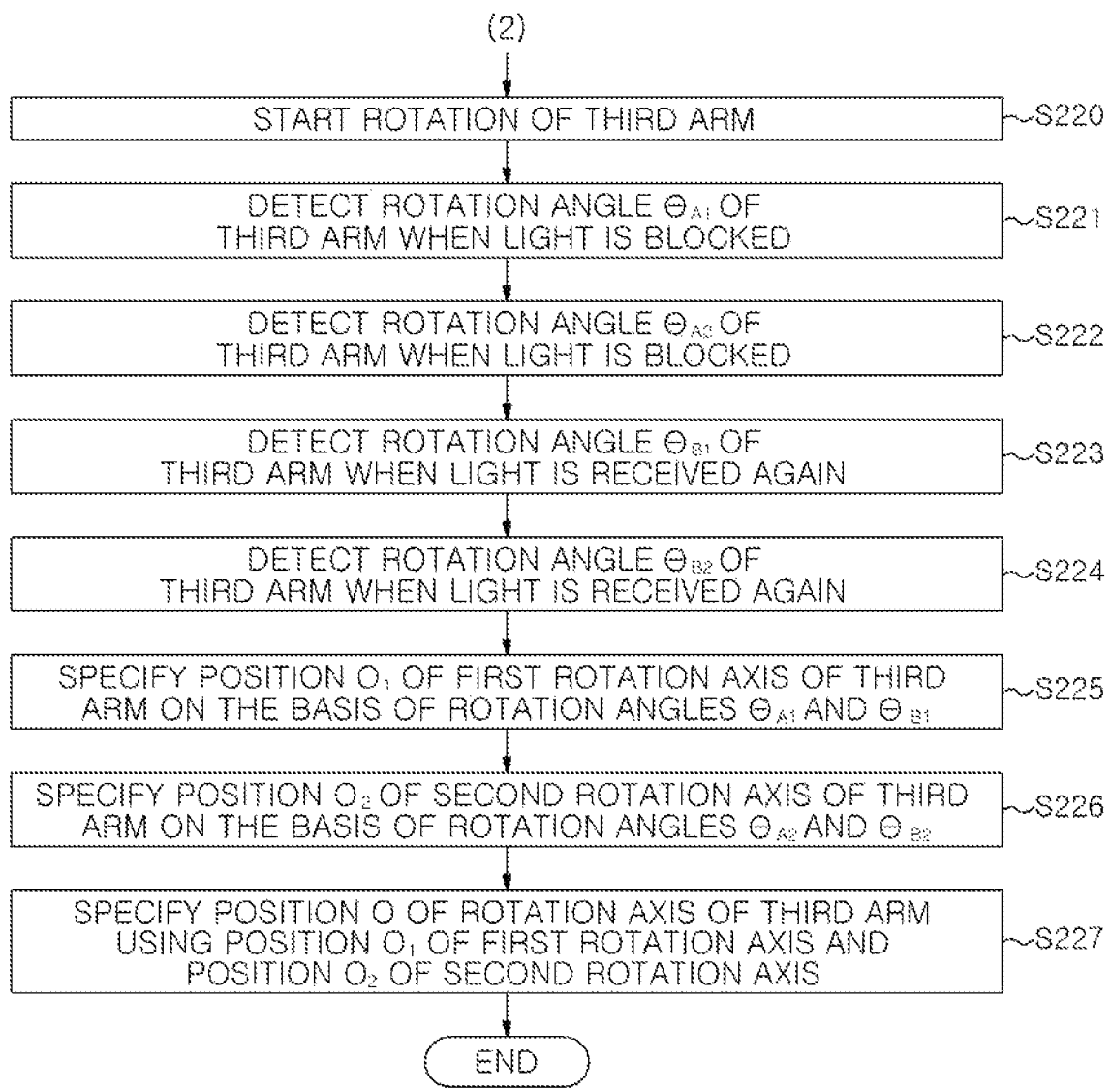
FIG. 17 is a flowchart illustrating the example of the teaching method of the robot arm according to the second embodiment.
Figure 18:
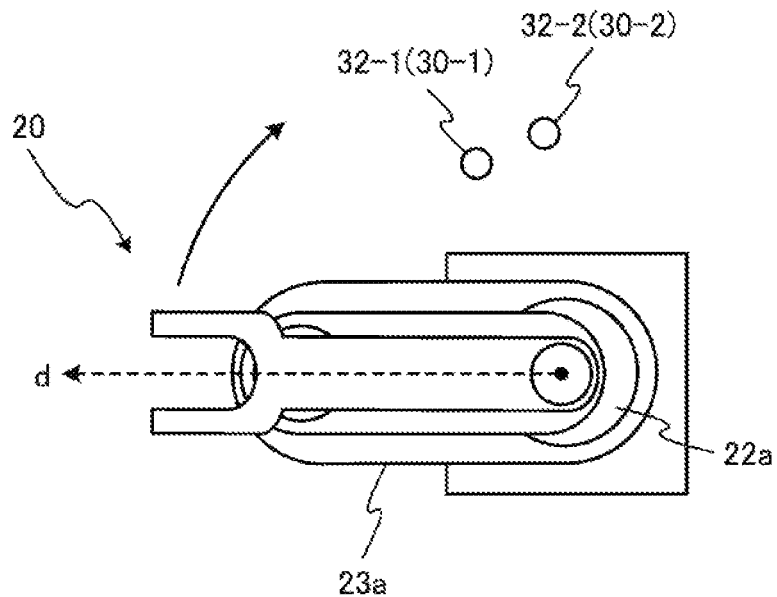
FIG. 18 is a view illustrating an example of a teaching procedure of a robot arm.

FIGS. 15 to 17 are flowcharts illustrating an example of a teaching method of the robot arm 20 according to the second embodiment. As the control device 100 controls the robot arm 20 and the sensors 30, processes illustrated in FIGS. 15 to 17 are realized. Before the processes illustrated in FIG. 15 start, the robot arm 20 is controlled, for example, to a position and posture as illustrated in FIG. 18. In the example illustrated in FIG. 17, the control device 100 controls the first driving unit 22a so that the first arm 23a faces a predetermined reference direction d in the vicinity of the light receiving units 32-1 and 32-2.

First, the control device 100 controls the light irradiation units 31-1 and 31-2 to irradiate light and confirms that the light irradiated from the light irradiation unit 31-1 is being received by the light receiving unit 32-1 and that the light irradiated from the light irradiation unit 31-2 is being received by the light receiving unit 32-2. In addition, for example, as illustrated in FIG. 18, the control device 100 controls the first driving unit 22a to start the rotation of the first arm 23a (S200). In the example of FIG. 18, although the first arm 23a is rotated in a clockwise direction, the first arm 23a may be rotated in a counterclockwise direction.

Figure 19:
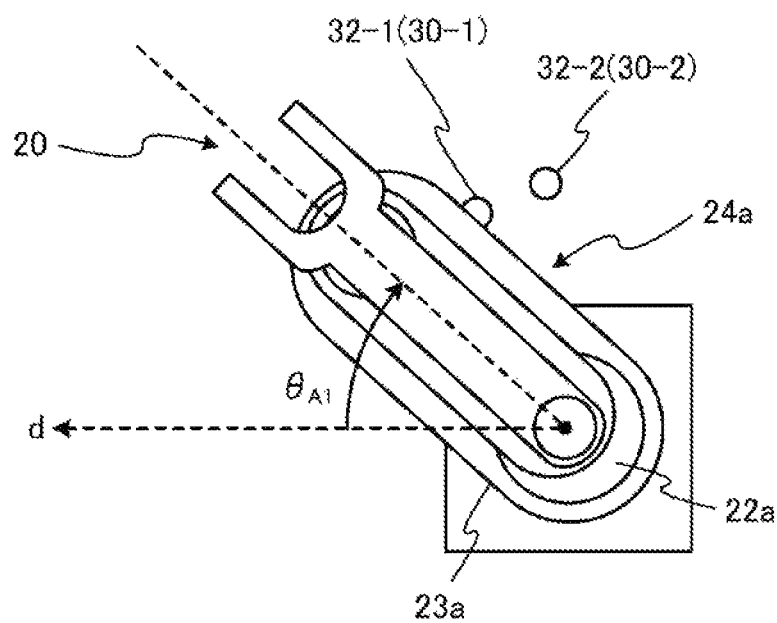
FIG. 19 is a view illustrating an example of the teaching procedure of the robot arm.

When the first arm 23a passes over the light receiving unit 32-1, for example, as illustrated in FIG. 19, the light irradiated from the light irradiation unit 31-1 is blocked by the first arm 23a and the light irradiated from the light irradiation unit 31-1 is not received by the light receiving unit 32-1. When the light irradiated from the light irradiation unit 31-1 is blocked by the first arm 23a, the control device 100 detects that a state in which the light irradiated from the light irradiation unit 31-1 is received by the light receiving unit 32-1 is changed to a state in which the light irradiated from the light irradiation unit 31-1 is not received by the light receiving unit 32-1. In addition, the control device 100 detects a rotation angle θA1 of the first arm 23a when the state in which the light irradiated from the light irradiation unit 31-1 is received by the light receiving unit 32-1 is changed to the state in which the light irradiated from the light irradiation unit 31-1 is not received by the light receiving unit 32-1 (S201). The step S201 is an example of a process a) and the rotation angle θA1 is an example of a first rotation angle.

Figure 20:
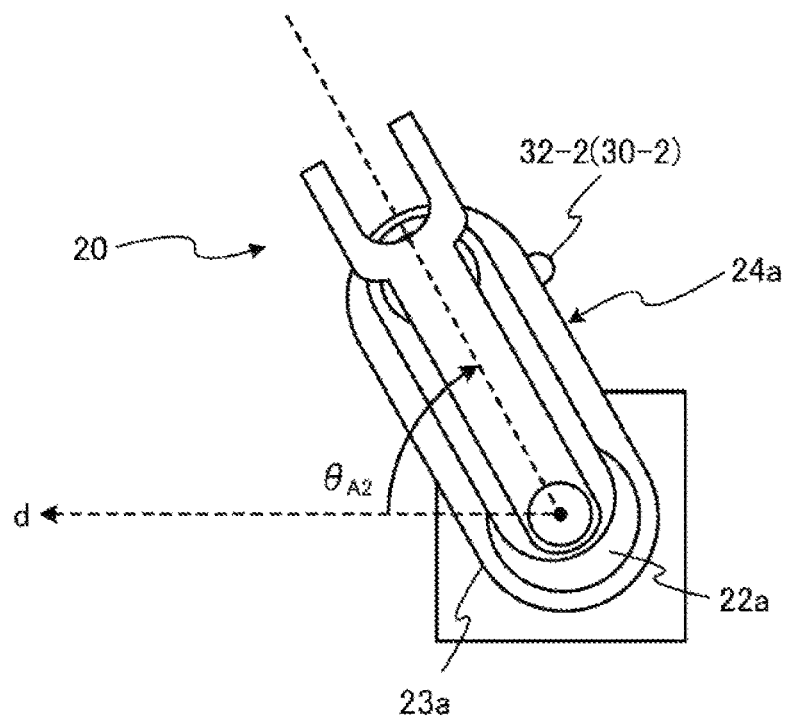
FIG. 20 is a view illustrating an example of the teaching procedure of the robot arm.

When the first arm 23a is further rotated, for example, as illustrated in FIG. 20, the light irradiated from the light irradiation unit 31-2 is blocked by the first arm 23a and the light irradiated from the light irradiation unit 31-2 is not received by the light receiving unit 32-2. When the light irradiated from the light irradiation unit 31-2 is blocked by the first arm 23a, the control device 100 detects that the state in which the light irradiated from the light irradiation unit 31-2 is received by the light receiving unit 32-2 is changed to the state in which the light irradiated from the light irradiation unit 31-2 is not received by the light receiving unit 32-2. In addition, the control device 100 detects a rotation angle θA2 of the first arm 23a when the state in which the light irradiated from the light irradiation unit 31-2 is received by the light receiving unit 32-2 is changed to the state in which the light irradiated from the light irradiation unit 31-2 is not received by the light receiving unit 32-2 (S202). The step S202 is an example of a process d) and the rotation angle θA2 is an example of a third rotation angle.

Figure 21:
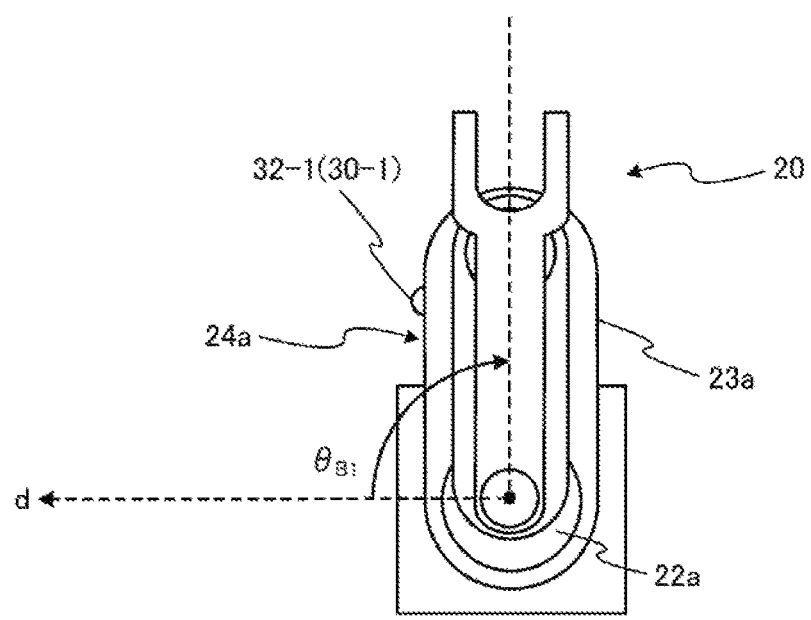
FIG. 21 is a view illustrating an example of the teaching procedure of the robot arm.

When the first arm 23a is further rotated, for example, as illustrated in FIG. 21, the blocking of the light irradiated from the light irradiation unit 31-1 is released and the light irradiated from the light irradiation unit 31-1 is received again by the light receiving unit 32-1. When the light blocking by the first arm 23a is released, the control device 100 detects that the state in which the light irradiated from the light irradiation unit 31-1 is not received by the light receiving unit 32-1 is changed to the state in which the light irradiated from the light irradiation unit 31-1 is received by the light receiving unit 32-1. In addition, the control device 100 detects a rotation angle θB1 of the first arm 23a when the state in which the light irradiated from the light irradiation unit 31-1 is not received by the light receiving unit 32-1 is changed to the state in which the light irradiated from the light irradiation unit 31-1 is received by the light receiving unit 32-1 (S203). The step S203 is an example of a process b) and the rotation angle θB1 is an example of a second rotation angle.

Figure 22:
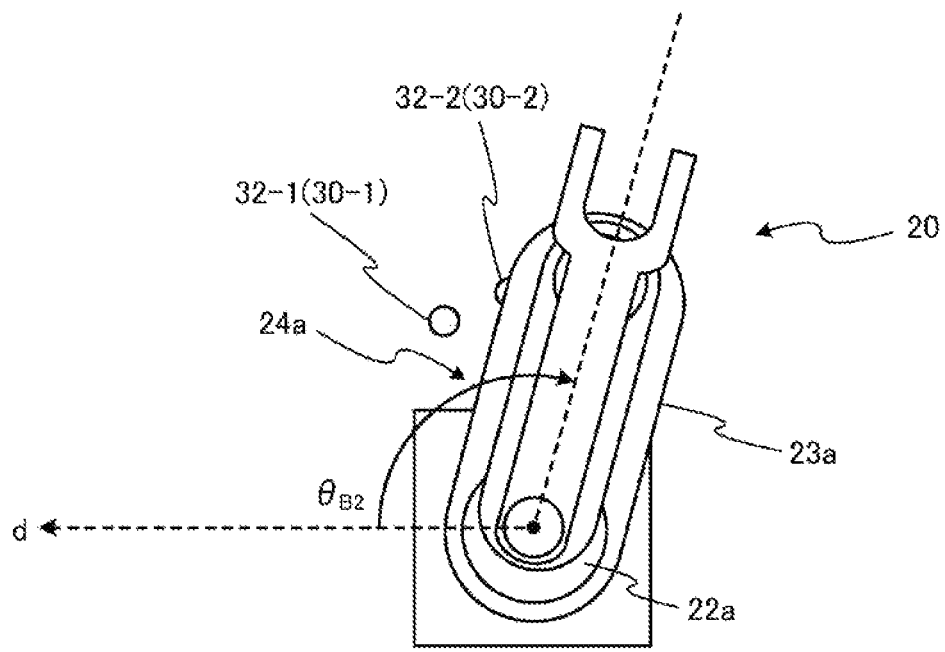
FIG. 22 is a view illustrating an example of the teaching procedure of the robot arm.

When the first arm 23a is further rotated, for example, as illustrated in FIG. 22, the blocking of the light irradiated from the light irradiation unit 31-2 is released and the light irradiated from the light irradiation unit 31-2 is received again by the light receiving unit 32-2. When the light blocking by the first arm 23a is released, the control device 100 detects that a state in which the light irradiated from the light irradiation unit 31-2 is not received by the light receiving unit 32-2 is changed to a state in which the light irradiated from the light irradiation unit 31-2 is received by the light receiving unit 32-2. In addition, the control device 100 detects a rotation angle θB2 of the first arm 23a when the state in which the light irradiated from the light irradiation unit 31-2 is not received by the light receiving unit 32-2 is changed to a state in which the light irradiated from the light irradiation unit 31-2 is received by the light receiving unit 32-2 (S204). The step S204 is an example of a process e) and the rotation angle θB2 is an example of a fourth rotation angle.

Next, the control device 100 specifies a position O1 of a first rotation axis of the first arm 23a (S205). The step S205 is an example of a process c). In step S205, the position O1 of the first rotation axis of the first arm 23a is specified based on a width of the first portion 24a of the first arm 23a passing through the optical path L1, a position P1 of an intersection of the optical path L1 and the first arm 23a, the rotation angle θA1, and the rotation angle θB1.

Figure 23:
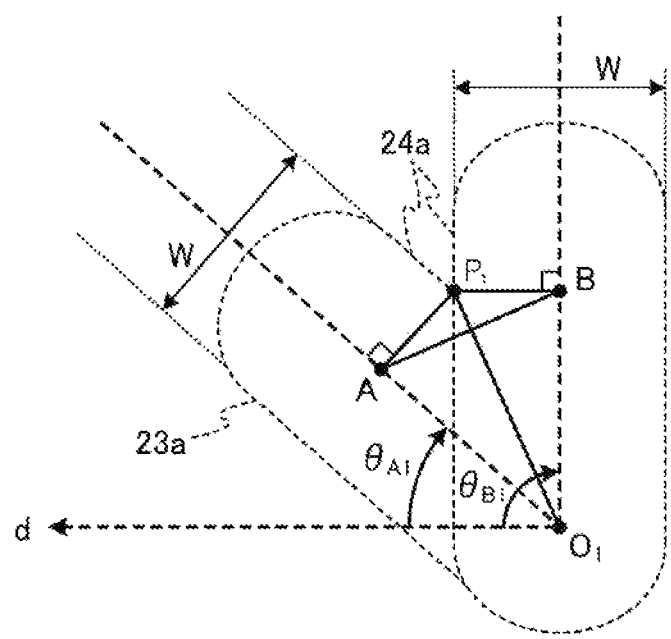
FIG. 23 is a view for describing an example of a method of specifying a position of a rotation axis of a first arm according to the second embodiment.

FIG. 23 is a view for describing an example of a method of specifying the position of the rotation axis of the first arm 23a according to the second embodiment. Since a triangle AO1B illustrated in FIG. 23 is an isosceles triangle and an angle ∠AO1B is (θB1−θA1), an angle ∠AO1P1 becomes (θB1−θA1)/2. Further, since a width W of the first portion 24a of the first arm 23a is known, a length of a side AP1 in a right triangle AO1P1 illustrated in FIG. 23 is W/2.

Accordingly, a length LP1O1 of a side P1O1 in the right triangle AO1P1 illustrated in FIG. 23 is expressed by the following Equation (2).

$$L_{P1O1} = \frac{\frac{W}{2}}{\sin\left(\frac{\theta_{B1} - \theta_{A1}}{2}\right)} \quad (2)$$

Since ∠AP1O1 is 90 degrees−∠AO1P1, a position separated by the length LP1O1 in the direction of ∠AP1O1 from the position P1 may be specified as the position O1 of the first rotation axis of the first arm 23a.

Next, the control device 100 specifies a position O2 of a second rotation axis of the first arm 23a (S206). The step S206 is an example of a process f). In step S206, the control device 100 specifies the position O2 of the second rotation axis of the first arm 23a on the basis of the width of the first portion 24a of the first arm 23a, the position P2 of an intersection of the optical path L2 and the first arm 23a, the rotation angle θA2, and the rotation angle θB2.

Figure 24:
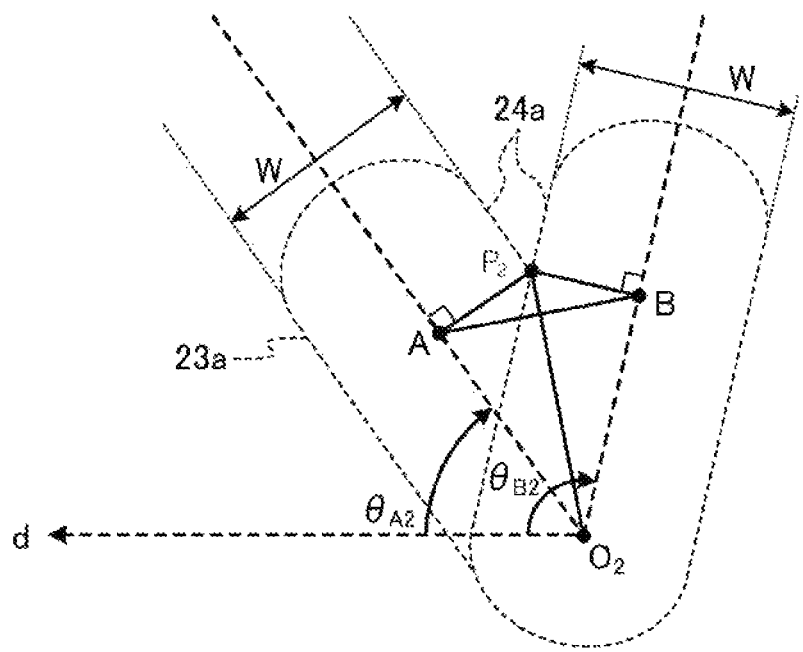
FIG. 24 is a view for describing an example of the method of specifying the position of the rotation axis of the first arm according to the second embodiment.

FIG. 24 is a view for describing an example of the method of specifying the position of the rotation axis of the first arm 23a according to the second embodiment. Since a triangle AO2B illustrated in FIG. 24 is an isosceles triangle and an angle ∠AO2B is (θB2−θA2), an angle ∠AO2P2 becomes (θB2−θA2)/2. Further, since a width W of the first portion 24a of the first arm 23a is known, a length of a side AP2 in a right triangle AO2P2 illustrated in FIG. 24 is W/2.

Accordingly, a length LP2O2 of a side P2O2 in the right triangle AO2P2 illustrated in FIG. 24 is expressed by the following Equation (3).

$$L_{P2O2} = \frac{\frac{W}{2}}{\sin\left(\frac{\theta_{B2} - \theta_{A2}}{2}\right)} \quad (3)$$

Since ∠AP$_2$O$_2$ is 90 degrees−∠AO$_2$P$_2$, a position separated by the length $L_{P2O2}$ in the direction of ∠AP$_2$O$_2$ from the position P$_2$ may be specified as the position O$_2$ of the second rotation axis of the first arm 23a.

Next, the control device 100 specifies a position O of the rotation axis of the first arm 23a using the position O1 of the first rotation axis and the position O2 of the second rotation axis (S207). The step S207 is an example of a process g). In step S207, for example, as illustrated in FIG. 25, an intersection of a first circle C1 having a position P1 as the center and passing through the position O1 of the first rotation axis and a second circle C2 having a position P2 as the center and passing through the position O2 of the second rotation axis is specified as the position O of the rotation axis of the first arm 23a.

Figure 25:
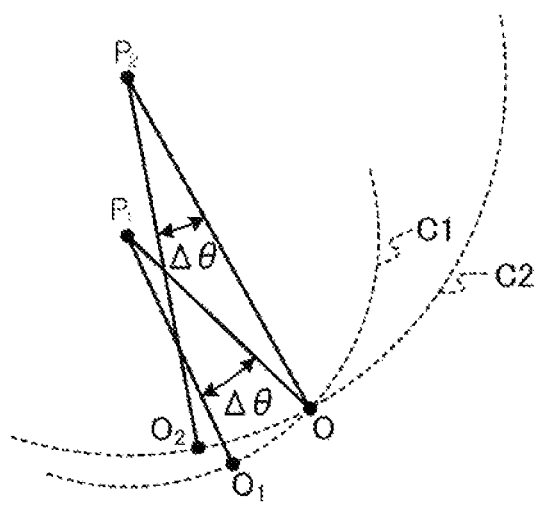
FIG. 25 is a view for describing an example of the method of specifying the position of the rotation axis of the first arm according to the second embodiment.

In addition, in FIG. 25, an angle formed by a line segment P1O1 and a line segment P1O and an angle formed by a line segment P2O2 and a line segment P2O are the same angle Δθ, and the angle Δθ is the same angle as a zero-point deviation of the angle of the first arm 23a. Therefore, by specifying the angle formed by the line segment P1O1 and the line segment P1O or the angle formed by the line segment P2O2 and the line segment P2O, a magnitude of the zero-point deviation of the angle of the first arm 23a may be specified. Accordingly, the zero-point deviation of the angle of the first arm 23a may be corrected based on the specified magnitude of the zero-point deviation.

Next, for example, as illustrated in FIG. 11, the control device 100 rotates the first arm 23a by the predetermined angle θ1 about the position O of the rotation axis specified in step S207 (S208).

Next, for example, in the state illustrated in FIG. 11, the control device 100 controls the second driving unit 22b to start the rotation of the second arm 23b in the clockwise direction (S210). In addition, when the second arm 23b passes over the light receiving unit 32-1, the light irradiated from the light irradiation unit 31-1 is blocked by the second arm 23b. Accordingly, the control device 100 detects that a state in which the light irradiated from the light irradiation unit 31-1 is received by the light receiving unit 32-1 is changed to a state in which the light irradiated from the light irradiation unit 31-1 is not received by the light receiving unit 32-1. In addition, the control device 100 detects a rotation angle θA1 of the second arm 23b when the state in which the light irradiated from the light irradiation unit 31-1 is received by the light receiving unit 32-1 is changed to the state in which the light irradiated from the light irradiation unit 31-1 is not received by the light receiving unit 32-1 (S211).

When the second arm 23b is further rotated, the second arm 23b passes over the light receiving unit 32-2, and thus the light irradiated from the light irradiation unit 31-2 is blocked by the second arm 23b. Accordingly, the control device 100 detects that a state in which the light irradiated from the light irradiation unit 31-2 is received by the light receiving unit 32-2 is changed to a state in which the light irradiated from the light irradiation unit 31-2 is not received by the light receiving unit 32-2. In addition, the control device 100 detects a rotation angle θA2 of the second arm 23b when the state in which the light irradiated from the light irradiation unit 31-2 is received by the light receiving unit 32-2 is changed to the state in which the light irradiated from the light irradiation unit 31-2 is not received by the light receiving unit 32-2 (S212).

When the second arm 23b is further rotated, the blocking of the light irradiated from the light irradiation unit 31-1 is released and the light irradiated from the light irradiation unit 31-1 is received again by the light receiving unit 32-1. When the light blocking by the second arm 23b is released, the control device 100 detects that the state in which the light irradiated from the light irradiation unit 31-1 is not received by the light receiving unit 32-1 is changed to the state in which the light irradiated from the light irradiation unit 31-1 is received by the light receiving unit 32-1. In addition, the control device 100 detects a rotation angle θB1 of the second arm 23b when the state in which the light irradiated from the light irradiation unit 31-1 is not received by the light receiving unit 32-1 is changed to the state in which the light irradiated from the light irradiation unit 31-1 is received by the light receiving unit 32-1 (S213).

When the second arm 23b is further rotated, the blocking of the light irradiated from the light irradiation unit 31-2 is released and the light irradiated from the light irradiation unit 31-2 is received again by the light receiving unit 32-2. When the light blocking by the second arm 23b is released, the control device 100 detects that the state in which the light irradiated from the light irradiation unit 31-2 is not received by the light receiving unit 32-2 is changed to the state in which the light irradiated from the light irradiation unit 31-2 is received by the light receiving unit 32-2. In addition, the control device 100 detects a rotation angle θB2 of the second arm 23b when the state in which the light irradiated from the light irradiation unit 31-2 is not received by the light receiving unit 32-2 is changed to the state in which the light irradiated from the light irradiation unit 31-2 is received by the light receiving unit 32-2 (S214).

Next, the control device 100 specifies the position O1 of the first rotation axis of the second arm 23b by a procedure similar to that in FIG. 23 (S215). In addition, the control device 100 specifies the position O2 of the second rotation axis of the second arm 23b by a procedure similar to that in FIG. 24 (S216). In addition, the control device 100 specifies a position O of a rotation axis of the second arm 23b using the position $O_1$ of the first rotation axis and the position $O_2$ of the second rotation axis by a procedure similar to that in FIG. 25. Further, a magnitude of a zero-point deviation of the angle of the second arm 23b is specified by the angle formed by the line segment $P_1O_1$ and the line segment $P_1O$ or the angle formed by the line segment $P_2O_2$ and the line segment $P_2O$ (S217). In addition, for example, as illustrated in FIG. 12, the control device 100 rotates the second arm 23b by the predetermined angle θ2 about the position O of the rotation axis specified in step S217 (S218).

Next, for example, in the state illustrated in FIG. 12, the control device 100 controls the third driving unit 22c to start the rotation of the third arm 23c in the clockwise direction (S220). In addition, when the third arm 23c passes over the light receiving unit 32-1, the light irradiated from the light irradiation unit 31-1 is blocked by the third arm 23c. Accordingly, the control device 100 detects that the state in which the light irradiated from the light irradiation unit 31-1 is received by the light receiving unit 32-1 is changed to the state in which the light irradiated from the light irradiation unit 31-1 is not received by the light receiving unit 32-1. In addition, the control device 100 detects a rotation angle θA' of the third arm 23c when the state in which the light irradiated from the light irradiation unit 31-1 is received by the light receiving unit 32-1 is changed to the state in which the light irradiated from the light irradiation unit 31-1 is not received by the light receiving unit 32-1 (S221).

When the third arm 23c is further rotated, the third arm 23c passes over the light receiving unit 32-2, and thus the light irradiated from the light irradiation unit 31-2 is blocked by the third arm 23c. Accordingly, the control device 100 detects that the state in which the light irradiated from the light irradiation unit 31-2 is received by the light receiving unit 32-2 is changed to the state in which the light irradiated from the light irradiation unit 31-2 is not received by the light receiving unit 32-2. In addition, the control device 100 detects a rotation angle θA2 of the third arm 23c when the state in which the light irradiated from the light irradiation unit 31-2 is received by the light receiving unit 32-2 is changed to the state in which the light irradiated from the light irradiation unit 31-2 is not received by the light receiving unit 32-2 (S222).

When the third arm 23c is further rotated, the blocking of the light irradiated from the light irradiation unit 31-1 is released and the light irradiated from the light irradiation unit 31-1 is received again by the light receiving unit 32-1. When the light blocking by the third arm 23c is released, the control device 100 detects that the state in which the light irradiated from the light irradiation unit 31-1 is not received by the light receiving unit 32-1 is changed to the state in which the light irradiated from the light irradiation unit 31-1 is received by the light receiving unit 32-1. In addition, the control device 100 detects a rotation angle θB1 of the third arm 23c when the state in which the light irradiated from the light irradiation unit 31-1 is not received by the light receiving unit 32-1 is changed to the state in which the light irradiated from the light irradiation unit 31-1 is received by the light receiving unit 32-1 (S223).

When the third arm 23c is further rotated, the blocking of the light irradiated from the light irradiation unit 31-2 is released and the light irradiated from the light irradiation unit 31-2 is received again by the light receiving unit 32-2. When the light blocking by the third arm 23c is released, the control device 100 detects that the state in which the light irradiated from the light irradiation unit 31-2 is not received by the light receiving unit 32-2 is changed to the state in which the light irradiated from the light irradiation unit 31-2 is received by the light receiving unit 32-2. In addition, the control device 100 detects a rotation angle θB2 of the third arm 23c when the state in which the light irradiated from the light irradiation unit 31-2 is not received by the light receiving unit 32-2 is changed to the state in which the light irradiated from the light irradiation unit 31-2 is received by the light receiving unit 32-2 (S224).

Next, the control device 100 specifies the position O1 of the first rotation axis of the third arm 23c by a procedure similar to that in FIG. 23 (S225). In addition, the control device 100 specifies the position O2 of the second rotation axis of the third arm 23c by a procedure similar to that in FIG. 24 (S226). In addition, the control device 100 specifies the position O of the rotation axis of the third arm 23c using the position O1 of the first rotation axis and the position O2 of the second rotation axis by a procedure similar to that in FIG. 25. Further, a magnitude of a zero-point deviation of the angle of the third arm 23c is specified by the angle formed by the line segment P1O1 and the line segment P1O or the angle formed by the line segment P2O2 and the line segment P2O (S227). In addition, the control device 100 ends the teaching method of the robot arm 20 illustrated in the present flowchart.

As described above, the second embodiment has been described. In the present embodiment, the processing system 1 has the light irradiation unit 31-1, the light irradiation unit 31-2, the light receiving unit 32-1, and the light receiving unit 32-2. The light irradiation unit 31-2 irradiates the light along the optical path L2 blocked by the first arm 23a at the position P2 different from the position P1 of the intersection of the optical path L1 and the first arm 23a. The light receiving unit 32-2 receives the light irradiated from the light irradiation unit 31-2. The control device 100 performs the process d) to the process g). In the process d), the rotation angle θA2 of the first arm 23a when the state in which the optical path L2 is not blocked by the first arm 23a is changed to the state in which the optical path L2 is blocked by the first arm 23a is detected based on whether the light irradiated from the light irradiation unit 31-2 is received by the light receiving unit 32-2. In the process e), the rotation angle θB2 of the first arm 23a when the state in which the optical path L2 is blocked by the first arm 23a is changed to the state in which the optical path L2 is not blocked by the first arm 23a is detected based on whether the light irradiated from the light irradiation unit 31-2 is received by the light receiving unit 32-2. In the process f), the position O2 of the second rotation axis of the first arm 23a is specified based on the width of the first portion 24a of the first arm 23a passing through the optical path L2, the position P2 of the intersection of the optical path L2 and the first arm 23a when the optical path L2 is blocked by the first arm 23a, the rotation angle θA2, and the rotation angle θB2. In the process g), the intersection of the first circle C1 having the position P1 as the center and passing through the position O1 of the first rotation axis and the second circle C2 having the position P2 as the center and passing through the position O2 of the second rotation axis is specified as the position O of the rotation axis after the first arm 23a is corrected. Further, the magnitude of the zero-point deviation of the angle of the first arm 23a is specified by the angle formed by the line segment P1O1 and the line segment P1O or the angle formed by the line segment P2O2 and the line segment P2O. Accordingly, even in the case in which the robot arm 20 in the vacuum transfer module 11 or the atmospheric transfer module 14 has a deviation in coordinates or rotation angle, etc., the control device 100 may detect and correct the amount of the deviations. For this reason, the teaching of the robot arm 20 may be performed precisely and simply.

In addition, teaching data tentatively pre-determined based on design values may be corrected or updated based on the values obtained by the method of the first embodiment or second embodiment described above. For example, the teaching data as the design value for each transfer destination such as the processing module 12 or the load lock module 13 is pre-stored in an auxiliary storage device or a storage unit such as a random access memory (RAM) or the like of the control device 100. The pre-stored teaching data includes, for example, information indicating how many degrees each rotation axis of the robot arm 20 should be rotated, information indicating the length of each arm, and the like. In addition, the teaching data pre-stored as the design value is corrected or updated by the method illustrated in the first embodiment or second embodiment described above on the basis of the sensing result. Thereafter, the control device 100 controls each arm of the robot arm 20 on the basis of the teaching data and transfers the substrate to each transfer destination.

[Hardware]

Figure 26:
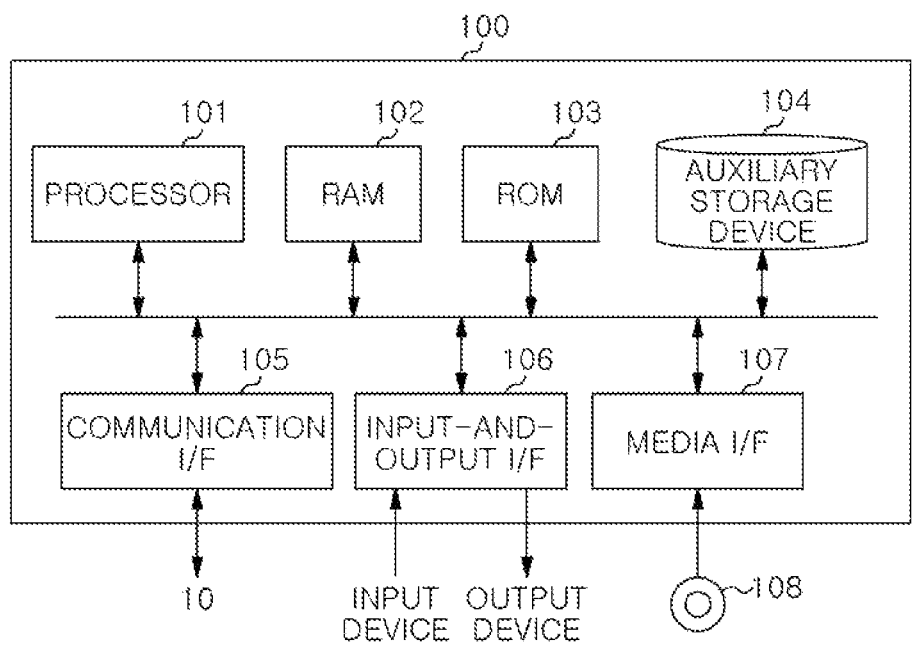
FIG. 26 is a diagram illustrating an example of hardware of a control device.

FIG. 26 is a diagram illustrating an example of hardware of the control device 100. The control device 100 includes a processor 101, a RAM 102, a read only memory (ROM) 103, an auxiliary storage device 104, a communication interface (I/F) 105, an input/output I/F 106, and a media I/F 107.

The processor 101 operates based on a program stored in the ROM 103 or auxiliary storage device 104 and controls each unit. The ROM 103 is configured to store a boot program that is executed by the processor 101 when the control device 100 starts, a program that depends on the hardware of the control device 100, and the like.

The auxiliary storage device 104 is, for example, a hard disk drive (HDD), a solid state drive (SSD), or the like, and the auxiliary storage device 104 is configured to store a program executed by the processor 101, data used by the program, and the like. The processor 101 reads the program from the auxiliary storage device 104, loads the program on the RAM 102, and executes the loaded program.

The communication I/F 105 performs communication with the main body 10 through a communication line for a local area network (LAN) or the like. The communication I/F 105 receives data from the main body 10 through the communication line and transmits the data to the processor 101, and transmits data generated by the processor 101 to the main body 10 through the communication line. The processor 101 obtains, for example, sensed information from the sensor 30 through the communication I/F 105. Further, the processor 101 transmits, for example, a control signal for driving the robot arm 20 to the robot arm 20 through the communication I/F 105.

The processor 101 controls an input device such as a keyboard or the like and an output device such as a display or the like through the input/output I/F 106. The processor 101 obtains a signal input from the input device and transmits the obtained signal to the processor 101 through the input/output I/F 106. Further, the processor 101 outputs the generated data to the output device through the input/output I/F 106.

The media I/F 107 is configured to read a program or data stored in a recording medium 108 and store the program or data in the auxiliary storage device 104. The recording medium 108 is, for example, an optical recording medium such as a digital versatile disc (DVD), a phase change rewritable disk (PD), or the like, a magneto-optical recording medium such as a magneto-optical disk (MO) or the like, a tape medium, a magnetic recording medium, a semiconductor memory, or the like.

The processor 101 of the control device 100 controls each unit of the main body 10 by executing a program loaded on the RAM 102. The processor 101 reads the program loaded on the RAM 102 from the recording medium 108 and stores the program in the auxiliary storage device 104, but as another example, the processor 101 may obtain a program from another device through the communication line and store the program in the auxiliary storage device 104. Alternatively, the processor 101 may load and execute the program obtained from another device through the communication line on the RAM 102 without storing the program in the auxiliary storage device 104.

Others

In addition, the technology disclosed in this specification is not limited to the above-described embodiments and may be variously modified within the subject matter of the present invention.

For example, in each of the above-described embodiments, the robot arm 20 transfers the substrate, but the disclosed technology is not limited thereto, and the robot arm 20 may transfer consumable parts such as an edge ring and the like in the processing module 12.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures.

What is claimed is:

1. A transfer device for transferring a substrate, the transfer device comprising:

a robot arm having an arm for transferring the substrate and a motor for rotating the arm;
a first light irradiator configured to irradiate light along a first optical path;
a first light receiving sensor configured to receive the light irradiated from the first light irradiator; and
a control device configured to control the motor so that the arm is rotated across the first optical path,
wherein the control device performs
a) a process of detecting a first rotation angle of the arm when a state in which the first optical path is not blocked by the arm is changed to a state in which the first optical path is blocked by the arm on the basis of whether the light irradiated from the first light irradiator is received by the first light receiving sensor,
b) a process of detecting a second rotation angle of the arm when the state in which the first optical path is blocked by the arm is changed to the state in which the first optical path is not blocked by the arm on the basis of whether the light irradiated from the first light irradiator is received by the first light receiving sensor, and
c) a process of specifying a position of a first rotation axis of the arm on the basis of a width of a portion of the arm passing through the first optical path, a position of a first intersection of the first optical path and the arm when the first optical path is blocked by the arm, the first rotation angle, and the second rotation angle.

2. The transfer device of claim 1, wherein:
the first light receiving sensor is provided on the first optical path; and
when a state in which the first light receiving sensor receives the light irradiated from the first light irradiator is changed to a state in which the first light receiving sensor does not receive the light irradiated from the first light irradiator, the control device determines that the state in which the first optical path is not blocked by the arm is changed to the state in which the first optical path is blocked by the arm, and
when the state in which the first light receiving sensor does not receive the light irradiated from the first light irradiator is changed to the state in which the first light receiving sensor receives the light irradiated from the first light irradiator, the control device determines that the state in which the first optical path is blocked by the arm is changed to the state in which the first optical path is not blocked by the arm.

3. The transfer device of claim 2, further comprising:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

4. The transfer device of claim 1, wherein the control device controls the motor so that a portion of the arm having a constant outer width is rotated across the first optical path of the light irradiated from the first light irradiator.

5. The transfer device of claim 4, further comprising:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

6. The transfer device of claim 1, wherein:
the arm has a first arm and a second arm provided on the first arm;
the motor has a first motor which rotates the first arm and a second motor which is provided on the first arm and rotates the second arm; and
the control device performs the process a) to the process c) on the first arm by controlling the first motor and performs the process a) to the process c) on the second arm by controlling the second motor after controlling the first arm to a predetermined posture on the basis of the position of the first rotation axis specified by the process c).

7. The transfer device of claim 6, further comprising:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

8. The transfer device of claim 1, further comprising:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

9. A teaching method of a robot arm in a transfer device, which includes a robot arm having an arm for transferring a substrate and a motor for rotating the arm, a first light irradiator configured to irradiate light along a first optical path, a first light receiving sensor configured to receive the light irradiated from the first light irradiator, and a control device configured to control the motor so that the arm is rotated across the first optical path, the teaching method performed by the control device comprising:
a) a process of detecting a first rotation angle of the arm when a state in which the first optical path is not blocked by the arm is changed to a state in which the first optical path is blocked by the arm on the basis of whether the light irradiated from the first light irradiator is received by the first light receiving sensor;
b) a process of detecting a second rotation angle of the arm when the state in which the first optical path is blocked by the arm is changed to the state in which the first optical path is not blocked by the arm on the basis of whether the light irradiated from the first light irradiator is received by the first light receiving sensor; and
c) a process of specifying a position of a first rotation axis of the arm on the basis of a width of a portion of the arm passing through the first optical path, a position of a first intersection of the first optical path and the arm when the first optical path is blocked by the arm, the first rotation angle, and the second rotation angle.

10. The teaching method of claim 9, wherein:
the first light receiving sensor is provided on the first optical path; and
when a state in which the first light receiving sensor receives the light irradiated from the first light irradiator is changed to a state in which the first light receiving sensor does not receive the light irradiated from the first light irradiator, the control device determines that the state in which the first optical path is not blocked by the arm is changed to the state in which the first optical path is blocked by the arm, and
when the state in which the first light receiving sensor does not receive the light irradiated from the first light irradiator is changed to the state in which the first light receiving sensor receives the light irradiated from the first light irradiator, the control device determines that the state in which the first optical path is blocked by the arm is changed to the state in which the first optical path is not blocked by the arm.

11. The teaching method of claim 10, wherein the transfer device further includes:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator, wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

12. The teaching method of claim 9, wherein the control device controls the motor so that a portion of the arm having a constant outer width is rotated across the first optical path of the light irradiated from the first light irradiator.

13. The teaching method of claim 12, wherein the transfer device further includes:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

14. The teaching method of claim 9, wherein:
the arm has a first arm and a second arm provided on the first arm;
the motor has a first motor for rotating the first arm and a second motor which is provided on the first arm and rotates the second arm; and
the control device performs the process a) to the process c) on the first arm by controlling the first motor and performs the process a) to the process c) on the second arm by controlling the second motor after controlling the first arm to a predetermined posture on the basis of the position of the first rotation axis specified by the process c).

15. The teaching method of claim 14, wherein the transfer device further includes:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor,
e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor,
f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and
g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

16. The teaching method of claim 9, wherein the transfer device further includes:
a second light irradiator configured to irradiate light along a second optical path blocked by the arm at a position different from the position of the first intersection of the first optical path and the arm when the first optical path is blocked by the arm; and
a second light receiving sensor configured to receive the light irradiated from the second light irradiator,
wherein the control device further performs
d) a process of detecting a third rotation angle of the arm when the state in which the second optical path is not blocked by the arm is changed to the state in which the second optical path is blocked by the arm on the basis of whether the light irradiated from the second light irradiator is received by the second light receiving sensor, e) a process of detecting a fourth rotation angle of the arm when the state in which the second optical path is blocked by the arm is changed to a state in which the second optical path is not blocked by the arm on the basis of whether the light irradiated from the second light irradiator is received by the second light receiving sensor, f) a process of specifying a position of a second rotation axis of the arm on the basis of a width of a portion of the arm passing through the second optical path, a position of a second intersection of the second optical path and the arm when the second optical path is blocked by the arm, the third rotation angle, and the fourth rotation angle, and g) a process of specifying an intersection of a first circle which is centered on the position of the first intersection and passes through the position of the first rotation axis and a second circle which is centered on the position of the second intersection and passes through the position of the second rotation axis as a position of a rotation axis after the arm is corrected.

* * * * *